(12) United States Patent
Herner et al.

(10) Patent No.: US 8,349,664 B2
(45) Date of Patent: *Jan. 8, 2013

(54) NONVOLATILE MEMORY CELL COMPRISING A DIODE AND A RESISTANCE-SWITCHING MATERIAL

(75) Inventors: Scott Brad Herner, San Jose, CA (US); Christopher J. Petti, Mountain View, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 105 days.

This patent is subject to a terminal disclaimer.

(21) Appl. No.: 12/855,462

(22) Filed: Aug. 12, 2010

(65) Prior Publication Data

US 2010/0302836 A1    Dec. 2, 2010

Related U.S. Application Data

(60) Division of application No. 11/395,995, filed on Mar. 31, 2006, now Pat. No. 7,812,404, which is a continuation-in-part of application No. 11/125,939, filed on May 9, 2005, now abandoned.

(51) Int. Cl.
*H01L 21/82* (2006.01)
(52) U.S. Cl. .................. 438/132; 257/E21.658
(58) Field of Classification Search .......... 438/128, 438/131, 132, 237, 238, 328; 257/E21.658, 257/E21.659, E21.662
See application file for complete search history.

(56) References Cited

U.S. PATENT DOCUMENTS

| | | | |
|---|---|---|---|
| 3,717,852 A | 2/1973 | Abbas et al. | |
| 3,795,977 A | 3/1974 | Berkenblit et al. | |
| 4,203,123 A | 5/1980 | Shanks | |
| 5,075,738 A | 12/1991 | Matsuda et al. | |
| 5,854,102 A | 12/1998 | Gonzalez et al. | |
| 7,405,465 B2 | 7/2008 | Herner | |
| 7,501,331 B2 * | 3/2009 | Herner | 438/486 |
| 2003/0193053 A1 | 10/2003 | Gilton | |
| 2004/0159835 A1 | 8/2004 | Krieger et al. | |
| 2004/0262591 A1 | 12/2004 | Campbell | |

(Continued)

FOREIGN PATENT DOCUMENTS

EP    1463061    9/2004

(Continued)

OTHER PUBLICATIONS

Schricker et al., U.S. Appl. No. 12/915,290, filed Oct. 29, 2010.

(Continued)

*Primary Examiner* — Quoc Hoang
(74) *Attorney, Agent, or Firm* — Dugan & Dugan, PC

(57) ABSTRACT

In a novel nonvolatile memory cell formed above a substrate, a diode is paired with a reversible resistance-switching material, preferably a metal oxide or nitride such as, for example, $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$. In preferred embodiments, the diode is formed as a vertical pillar disposed between conductors. Multiple memory levels can be stacked to form a monolithic three dimensional memory array. In some embodiments, the diode comprises germanium or a germanium alloy, which can be deposited and crystallized at relatively low temperatures, allowing use of aluminum or copper in the conductors. The memory cell of the present invention can be used as a rewriteable memory cell or a one-time-programmable memory cell, and can store two or more data states.

51 Claims, 11 Drawing Sheets

U.S. PATENT DOCUMENTS

2005/0052915 A1* 3/2005 Herner et al. .............. 365/202
2006/0131554 A1 6/2006 Joung et al.
2006/0250837 A1 11/2006 Herner et al.
2011/0147693 A1 6/2011 Schricker et al.

FOREIGN PATENT DOCUMENTS

EP 1484798 12/2004

OTHER PUBLICATIONS

Extended Search Report of related European Patent Application No. 10009111.5 mailed Oct. 28, 2010.
Extended Search Report of related European Patent Application No. 10009110.7 mailed Oct. 28, 2010.
Extended Search Report of related European Patent Application No. 10009109.9 mailed Oct. 28, 2010.
Extended Search Report of related European Patent Application No. 10009108.1 mailed Oct. 28, 2010.
Nov. 25, 2010 Reply to Aug. 25, 2010 Office Action of related Taiwan Patent Application No. 096111498.
Kumar et al., U.S. Appl. No. 13/007,812, filed Jan. 17, 2011.
Jeong, I.-S. et al., "Ultraviolet-enhanced photodiode employing n-ZnO/p-Si Structure", Applied Physics Letter, vol. 83, 2003, p. 2946.
Office Action of related European Patent Application No. 10009110.7 mailed Sep. 8, 2011.
Office Action of related European Patent Application No. 10009108.1 mailed Sep. 8, 2011.
Office Action of related European Patent Application No. 10009111.5 mailed Sep. 8, 2011.
Office Action of related European Patent Application No. 10009109.9 mailed Sep. 8, 2011.
Office Action of U.S. Appl. No. 11/395,995 mailed Mar. 31, 2010.
Apr. 13, 2010 Reply to Office Action of U.S. Appl. No. 11/395,995 mailed Mar. 31, 2010.
Notice of Allowance of U.S. Appl. No. 11/395,995 dated May 14, 2010.
Restriction Requirement of U.S. Appl. No. 11/125,939 mailed Oct. 2, 2006.
Dec. 1, 2006 Reply to Restriction Requirement of U.S. Appl. No. 11/125,939 mailed Oct. 2, 2006.
Restriction Requirement of U.S. Appl. No. 11/395,995 mailed Jun. 12, 2007.
Jul. 11, 2007 Reply to Restriction Requirement of U.S. Appl. No. 11/395,995 mailed Jun. 12, 2007.
Restriction Requirement of U.S. Appl. No. 11/395,995 mailed Sep. 27, 2007.
Oct. 29, 2007 Reply to Restriction Requirement of U.S. Appl. No. 11/395,995 mailed Sep. 27, 2007.
Terminal Disclaimer of Patent No. 7,501,331 filed in U.S. Appl. No. 11/395,995 on Apr. 13, 2010.
Aug. 25, 2010 Office Action of related Taiwan Patent Application No. 096111498.
Sep. 17, 2012 Response to Jul. 18, 2012 Office Action of related Korean Patent Application No. 10-2007-7027841.

* cited by examiner

Nondirectional Resistance Switching

Directional Resistance Switching: Low-Resistance to High-Resistance

Directional Resistance Switching: High-Resistance to Low-Resistance

US 8,349,664 B2

NONVOLATILE MEMORY CELL COMPRISING A DIODE AND A RESISTANCE-SWITCHING MATERIAL

REFERENCE TO RELATED APPLICATIONS

This application is a division of U.S. patent application Ser. No. 11/395,995, filed Mar. 31, 2006, now U.S. Pat. No. 7,812, 404, which is a continuation-in-part of U.S. patent application Ser. No. 11/125,939, filed May 9, 2005, subsequently abandoned, hereinafter the '939 application, which is assigned to the assignee of the present invention and is hereby incorporated by reference in its entirety.

This application is related to U.S. patent application Ser. No. 11/394,903, "Multilevel Nonvolatile Memory Cell Comprising a Resistivity-Switching Oxide or Nitride and an Antifuse," and to U.S. patent application Ser. No. 11/395,421, "Nonvolatile Rewritable Memory Cell Comprising a Resistance-Switching Oxide or Nitride and an Antifuse," both filed on Mar. 31, 2006, and hereby incorporated by reference in their entirety.

BACKGROUND

The invention relates to a rewriteable nonvolatile memory array in which each cell comprises a diode and a resistance-switching element in series. Resistance-switching materials, which can reversibly be converted between a high-resistance state and a low-resistance state, are known. These two stable resistance states make such materials an attractive option for use in a rewriteable non-volatile memory array. It is very difficult to form a large, high-density array of such cells, however, due to the danger of disturbance between cells, high leakage currents, and myriad fabrication challenges. There is a need, therefore, for a large rewriteable nonvolatile memory array using resistance-switching elements which can be readily fabricated and reliably programmed.

SUMMARY

The present invention is defined by the following claims, and nothing in this section should be taken as a limitation on those claims. In general, the invention is directed to a nonvolatile memory cell comprising a diode and a resistance-switching material.

A first aspect of the invention provides for a method for forming a plurality of nonvolatile memory cells, the method including: forming a first plurality of substantially parallel, substantially coplanar first conductors; forming a first plurality of diodes above the first conductors; forming a first plurality of resistance-switching elements; and forming a second plurality of substantially parallel, substantially coplanar conductors above the first diodes, wherein the first resistance-switching elements comprise a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

A second aspect of the invention provides for a method for forming a monolithic three dimensional memory array, the method including: a) forming a first memory level above a substrate, the first memory level formed by a method including: i) forming a first plurality of diodes; and ii) forming a first plurality of resistance-switching elements comprising material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, wherein each of the first diodes is arranged in series with one of the resistance-switching elements; and b) monolithically forming at least a second memory level above the first memory level and above the substrate.

A third aspect of the invention provides for a method for forming a monolithic three dimensional memory array, the method including: forming a first plurality of substantially parallel, substantially coplanar conductors at a first height above a substrate and extending in a first direction; forming a second plurality of substantially parallel, substantially coplanar conductors at a second height above the first height and extending in a second direction different from the first direction; forming a first plurality of resistance-switching elements comprising a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$; forming a first plurality of diodes, wherein the first diodes and the first resistance switching elements are above the first height and below the second height; forming second diodes above the second conductors; and forming third conductors above the second conductors.

A fourth aspect of the invention provides for a method for forming a nonvolatile memory cell, the method including: forming a first conductor; forming a second conductor; forming a resistance-switching element; and forming a diode, wherein the diode and the resistance-switching element are disposed electrically in series between the first conductor and the second conductor, and wherein, during formation of the first and second conductors, diode, and switching element and crystallization of the diode, temperature does not exceed about 500° C.

A fifth aspect of the invention provides for a method for forming a monolithic three dimensional memory array, the method including: i) forming a first memory level above a substrate, the first memory level comprising a plurality of first memory cells, each first memory cell comprising: a) a resistance-switching element; and b) a diode, wherein the temperature during formation of the first memory level does not exceed about 475° C.; and ii) monolithically forming at least a second memory level about the first memory level.

A sixth aspect of the invention provides for a method for programming a memory cell in a memory array, wherein the memory cell comprises a resistivity-switching layer of a metal oxide or nitride compound, the metal oxide or nitride compound including exactly one metal, the method including: programming the memory cell by changing the resistivity-switching layer from a first resistivity state to a second programmed resistivity state, wherein the second programmed resistivity state stores a data state of the memory cell.

A seventh aspect of the invention provides for a method for programming and sensing a memory cell in a memory array, wherein the memory cell comprises a resistivity-switching layer of a metal oxide or nitride compound, the metal oxide or nitride compound including exactly one metal, and a diode comprising polycrystalline semiconductor material, the resistivity-switching layer and the diode arranged electrically in series, the method including: i) applying a first programming pulse to the memory cell wherein the first programming pulse: a) detectably changes a first resistivity state of the resistivity-switching layer; or b) detectably changes a second resistivity state of the polycrystalline semiconductor material, or c) detectably changes the first resistivity state of the resistivity-switching layer and detectably changes the second resistivity state of the polycrystalline semiconductor material; and ii) reading the memory cell, wherein the first resistivity state of the resistivity switching layer serves to store data and the second resistivity state of the polycrystalline semiconductor material serves to store data.

Each of the aspects and embodiments of the invention described herein can be used alone or in combination with one another. The preferred aspects and embodiments will now be described with reference to the attached drawings.

DETAILED DESCRIPTION

A variety of materials show reversible resistivity-switching behavior. These materials include chalcogenides, carbon polymers, perovskites, and certain metal oxides and nitrides. Specifically, there are metal oxides and nitrides which include only one metal and exhibit reliable resistivity switching behavior, as described by Pagnia and Sotnick in "Bistable Switching in Electroformed Metal-Insulator-Metal Device," Phys. Stat. Sol. (A) 108, 11-65 (1988). This group includes, for example, $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, where x and y range between 0 and 1.

Examples are the stoichiometric compounds NiO, $Nb_2O_5$, $TiO_2$, $HfO_2$, $Al_2O_3$, MgO, CoO, $CrO_2$, VO, ZnO, ZrO, BN, and AlN, but nonstoichiometric compounds may be used as well. A layer of one of these materials may be formed in an initial state, for example a relatively low-resistivity state. Upon application of sufficient voltage, the material switches to a stable high-resistivity state.

This resistivity switching is reversible; subsequent application of appropriate current or voltage can serve to return the resistivity-switching material to a stable low-resistivity state. This conversion can be repeated many times. For some materials, the initial state is high-resistivity rather than low-resistance. When this discussion refers to "resistivity-switching material," "resistivity-switching metal oxide or nitride," "resistance-switching memory element" or similar terms, it will be understood that a reversible resistivity-switching material is meant.

These resistivity-switching materials thus are of interest for use in nonvolatile memory arrays. One resistivity state may correspond to a data "0," for example, while another resistivity state corresponds to a data "1." Some of these materials may have more than two stable resistivity states; indeed some may be able to achieve any of a plurality of data states.

To make a memory cell using these materials, the difference in resistivity between the high-resistivity state and the low-resistivity state must be large enough to be readily detectable. For example, the resistivity of the material in the high-resistivity state should be at least three times that of the material in the low-resistivity state.

When this discussion refers to "resistivity-switching material," "resistivity-switching metal oxide or nitride," "resistance-switching memory element" or similar terms, it will be understood that the difference between the low- and high-resistance or low- or high-resistivity states is at least a factor of three.

Figure 1:
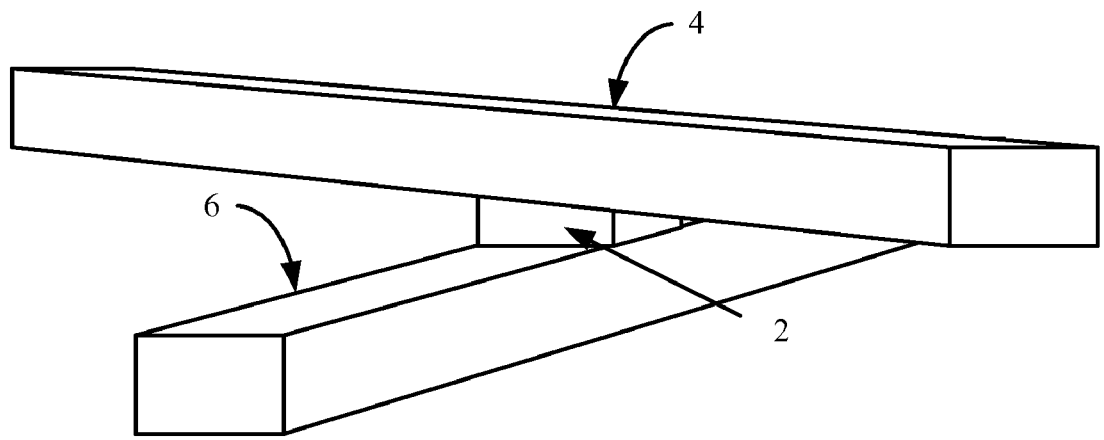
FIG. 1 is a perspective view of a possible memory cell having a resistance-switching material disposed between conductors.

Many obstacles exist to using these resistivity-switching materials in a large nonvolatile memory array, however. In one possible arrangement a plurality of memory cells are formed, each as shown in FIG. 1, comprising a resistance-switching memory element 2 (comprising one of the resistivity-switching materials named), disposed between conductors, for example between a top conductor 4 and a bottom conductor 6, in a cross-point array. A resistance-switching memory element 2 is programmed by applying voltage between the top conductor 4 and bottom conductor 6.

In a large array of such cells arranged in a cross-point array, many cells will be addressed by the same top conductor or bottom conductor. When relatively large voltage or current is required, there is danger that memory cells sharing a top or bottom conductor with the cell to be addressed will be exposed to sufficient voltage or current to cause undesired resistance switching in those half-selected cells. Depending on the biasing scheme used, excessive leakage current across unselected cells may also be a concern.

In the present invention, a diode is paired with a resistivity-switching material to form a rewriteable nonvolatile memory cell that can be formed and programmed in a large, high-density array. Using the methods described herein, such an array can be reliably fabricated and programmed.

Figure 2:
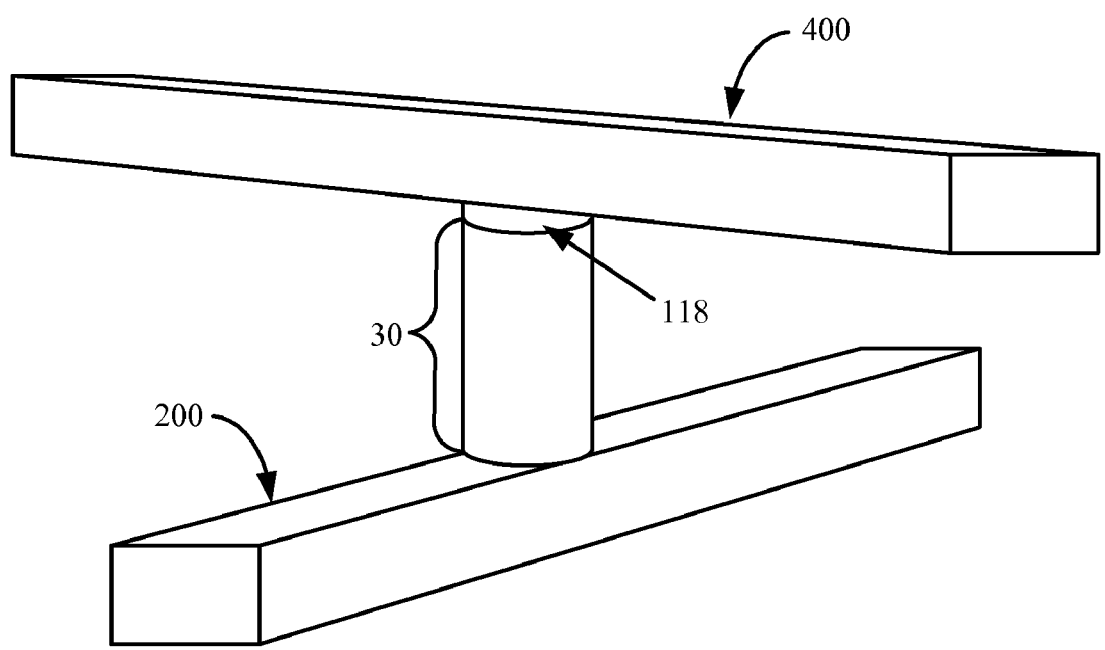
FIG. 2 is a perspective view of a rewriteable nonvolatile memory cell formed according to the present invention.

Though many embodiments are possible and an illustrative selection will be described, a simple version of a memory cell formed according to the present invention is shown in FIG. 2. The cell includes a bottom conductor 200 comprising conductive material, for example heavily doped semiconductor material, conductive silicides, or preferably a metal, for example tungsten, aluminum, or copper. Formed above this is a top conductor 400, which may be of the same material as the bottom conductor.

The rail-shaped top and bottom conductors preferably extend in different directions; for example they may be perpendicular. The conductors may include conductive barrier or adhesion layers as required. Disposed between the top conductor 400 and bottom conductor 200 are a diode 30 and a resistance-switching element 118 arranged in series. Other layers, for example barrier layers, may also be included between conductors 200 and 400.

The resistance-switching element 118 is converted from the low-resistance state to the high-resistance state, or, alternatively, from the high-resistance state to the low-resistance state, upon application of voltage across or flow of current through the resistance-switching element 118. The conversion from low resistance to high resistance is reversible.

The diode 30 acts as a one-way valve, conducting current more easily in one direction than in the other. Below a critical "turn-on" voltage in the forward direction, the diode 30 conducts little or no current. By use of appropriate biasing schemes, when an individual cell is selected for programming, the diodes of neighboring cells can serve to electrically isolate the resistance-switching elements of those cells and thus prevent inadvertent programming, so long as the voltage across unselected or half-selected cells does not exceed the turn-on voltage of the diode when applied in the forward direction, or the reverse breakdown voltage when applied in the reverse direction.

Figure 3:
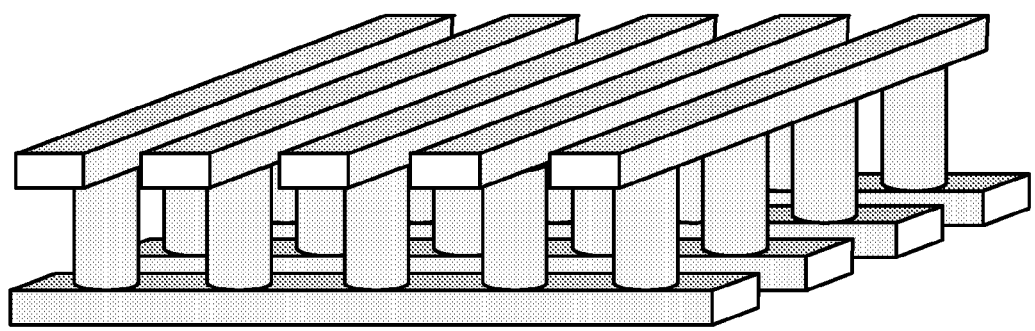
FIG. 3 is a perspective view of a memory level comprising cells like those shown in FIG. 2.

A plurality of such top and bottom conductors, with intervening diodes and resistance-switching elements, can be fabricated, forming a first memory level, a portion of which is shown in FIG. 3. In preferred embodiments, additional memory levels can be formed stacked above this first memory level, forming a highly dense monolithic three dimensional memory array. The memory array is formed of deposited and grown layers above a substrate, for example a monocrystalline silicon substrate. Support circuitry is advantageously formed in the substrate below the memory array.

An advantageous method for making a dense nonvolatile one-time programmable memory array which is reliably manufacturable is taught in U.S. patent application Ser. No. 10/326,470, hereinafter the '470 application, since abandoned, and hereby incorporated by reference.

Related memory arrays, and their use and methods of manufacture, are taught in U.S. patent application Ser. No. 10/955,549, "Nonvolatile Memory Cell Without a Dielectric Antifuse Having High- and Low-Impedance States," filed Sep. 29, 2004 and hereinafter the '549 application, U.S. patent application Ser. No. 11/015,824, "Nonvolatile Memory Cell Comprising a Reduced Height Vertical Diode," filed Dec. 17, 2004, and hereinafter the '824 application, and in U.S. patent application Ser. No. 10/954,577, "Junction Diode Comprising Varying Semiconductor Compositions," filed Sep. 29, 2004, and hereinafter the '577 application, all owned by the assignee of the present application and hereby incorporated by reference. Methods taught in these incorporated applications will be useful in fabricating a memory array according to the present invention.

Fabrication Options

Preferred embodiments include several important variations. In general, the properties of the resistivity-switching material selected, and the manner in which the memory cell is intended to be used, will determine which embodiments are most advantageous.

Figure 4:
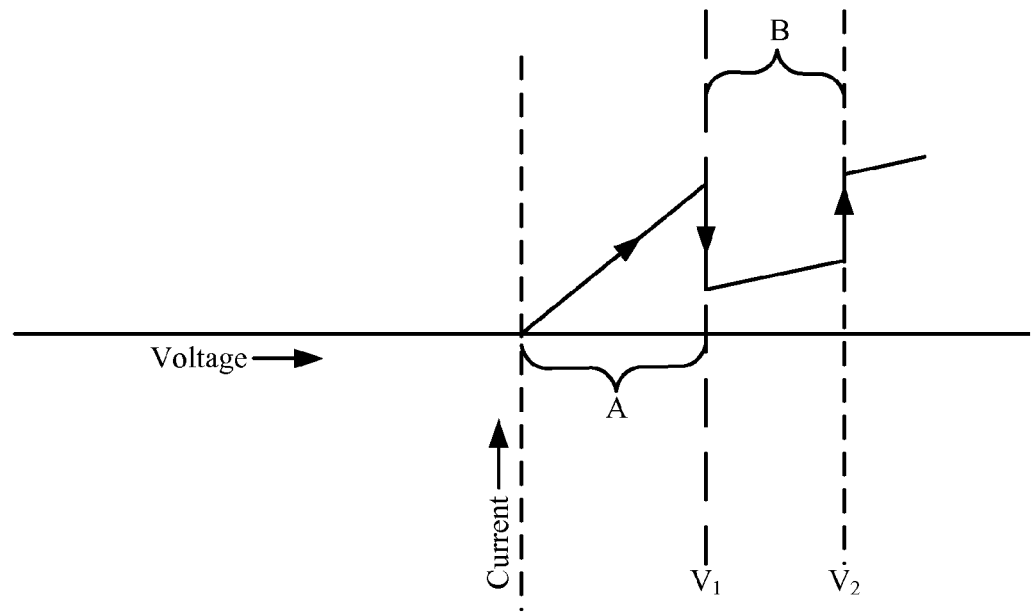
FIG. 4 is an I-V curve showing the low-to-high and high-to-low resistance conversions of nondirectional resistance-switching material.

Nondirectional vs. Directional Switching: In general, the resistance-switching metal oxides and nitrides named earlier exhibit one of two general kinds of switching behavior. Referring to the I-V curve of FIG. 4, some of these materials are initially in a low-resistivity state, in area A on the graph. Current flows readily for applied voltage until a first voltage $V_1$ is reached. At voltage $V_1$ the resistivity-switching material converts to a high-resistivity state, shown in area B, and reduced current flows.

At a certain critical higher voltage $V_2$, the material switches back to the initial low-resistivity state, and increased current flows. Arrows indicate the order of state changes. This conversion is repeatable. For these materials, the direction of current flow and of voltage bias is immaterial; thus these materials will be referred to as nondirectional. Voltage $V_1$ may be called the reset voltage while voltage $V_2$ may be called the set voltage.

Figure 5A:
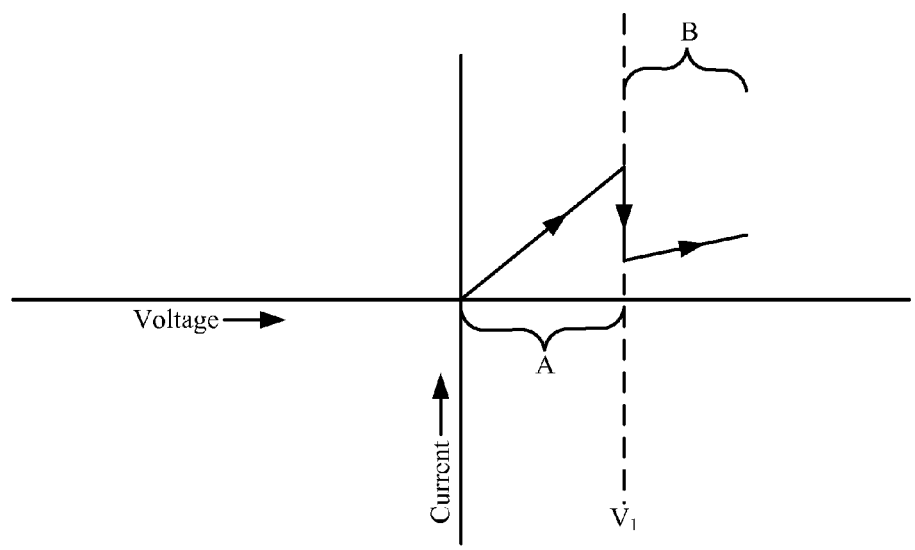
FIG. 5A is an I-V curve showing the low-to-high resistance conversion of directional resistance-switching material.
Figure 5B:
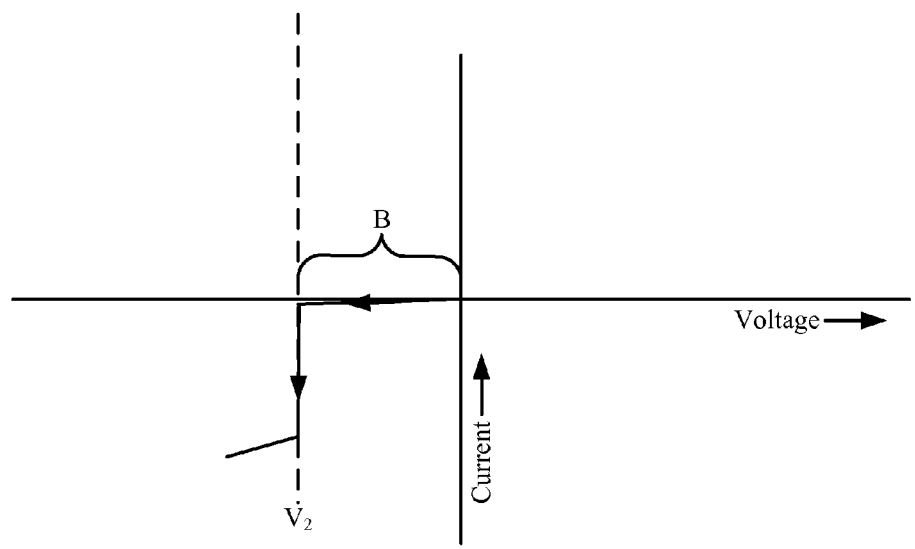
FIG. 5B is an I-V curve showing the high-to-low resistance conversion of directional resistance-switching material.

Others of the resistivity-switching materials, on the other hand, behave as shown in FIGS. 5A and 5B, and will be called directional. Directional resistivity-switching materials may also be formed in a low-resistance state, shown in area A of FIG. 5A. Current flows readily for applied voltage until a first voltage $V_1$, the reset voltage, is reached. At voltage $V_1$ the directional resistivity-switching material converts to a high-resistivity state, shown in area B in FIG. 5A.

To convert directional resistivity-switching material back to the low-resistivity state, however, a reverse voltage must be applied. As shown in FIG. 5B, the directional resistivity-switching material is high-resistance in area B at negative voltage until a critical reverse voltage $V_2$, the set voltage. At this voltage the directional resistivity-switching material reverts to the low-resistivity state. Arrows indicate the order of state changes. (Some materials are initially formed in a high-resistivity state. The switching behavior is the same; for simplicity only one initial state has been described.)

In preferred embodiments, nondirectional resistivity-switching materials may be paired with a substantially one-directional diode. One such diode is a p-i-n diode, shown in FIG. 6. A preferred p-i-n diode is formed of semiconductor material, for example silicon, and includes a bottom heavily doped region 12 having a first conductivity type, a middle intrinsic region 14 which is not intentionally doped, and a top heavily doped region 16 having a second conductivity type opposite the first.

Figure 6:
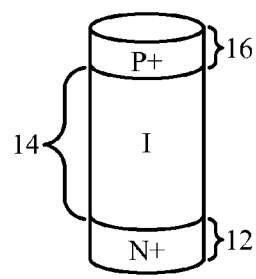
FIG. 6 is a perspective view of a vertically oriented p-i-n diode preferred in some embodiments of the present invention.

In the p-i-n diode of FIG. 6, bottom region 12 is n-type while top region 16 is p-type; if desired the polarity can be reversed. A region of intrinsic semiconductor material like region 14, while not intentionally doped, will never be perfectly electrically neutral. In many fabrication processes, defects in intrinsic deposited silicon cause this material to behave as though slightly n-type. In some embodiments, it may be preferred to lightly dope this region.

Figure 8:
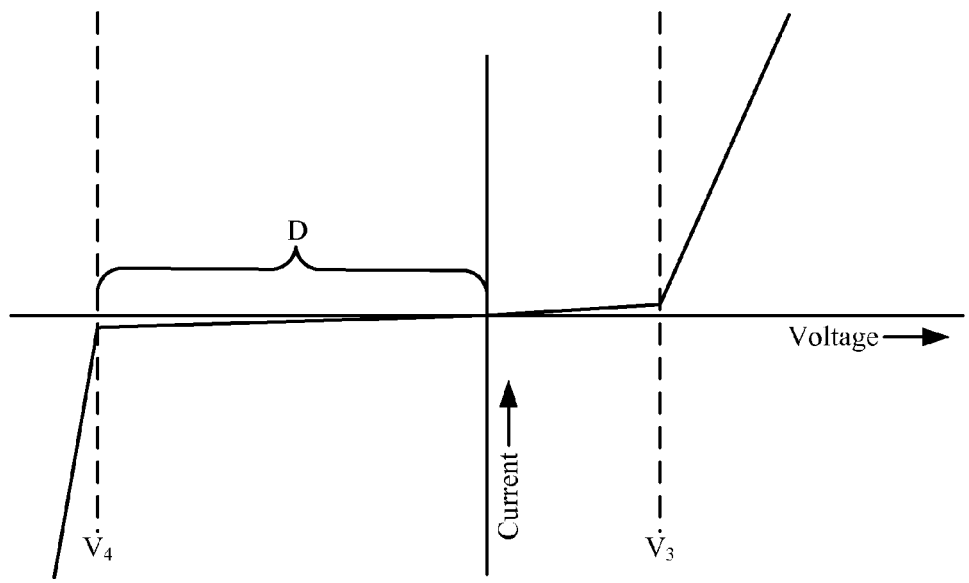
FIG. 8 is an I-V curve of a p-i-n diode like the diode of FIG. 6.

Upon application of voltage, such a diode behaves as shown by the I-V curve of FIG. 8. Little or no current flows at very low voltage. At a critical voltage $V_3$, the turn-on voltage of the diode, the diode begins to conduct and significant forward current flows. When the diode is placed under low and moderate reverse voltages, as in area D of FIG. 8, little or no current flows; the diode acts as a one-way valve.

Upon application of very high reverse voltage $V_4$, however, the diode will suffer avalanche breakdown and a reverse current will begin to flow. This event may be destructive to the diode, though ideally it is not. Recall that both the set and reset voltages of a nondirectional resistance switching material require current in only one direction. Thus the p-i-n diode of FIG. 6 can successfully be paired with a nondirectional resistance-switching material.

As illustrated in the I-V curve of FIGS. 5A and 5B, however, for successful switching, directional resistivity-switching materials must be exposed to both forward and reverse current. The low-resistivity-to-high-resistivity conversion shown in FIG. 5B requires reverse current (at voltage $V_2$.) Reverse current is only achieved in a one-way diode at the reverse breakdown voltage (voltage $V_4$ in FIG. 8), which is generally relatively high, for example at least 9 volts.

Directional resistivity-switching materials thus may not advantageously be paired with a one-way diode. Instead such materials may be paired with a reversible non-ohmic device, i.e. one that allows current flow in either direction. One such device is a Zener diode.

Figure 7:
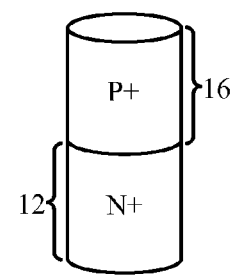
FIG. 7 is a perspective view of a vertically oriented Zener diode preferred in other embodiments of the present invention.

An exemplary Zener diode is shown in FIG. 7. It will be seen that such a diode has a first heavily doped region 12 of a first conductivity type and a second heavily doped region 16 of the opposite conductivity type. The polarity could be reversed. There is no intrinsic region in the Zener diode of FIG. 7; in some embodiments there may be a very thin intrinsic region.

Figure 9:
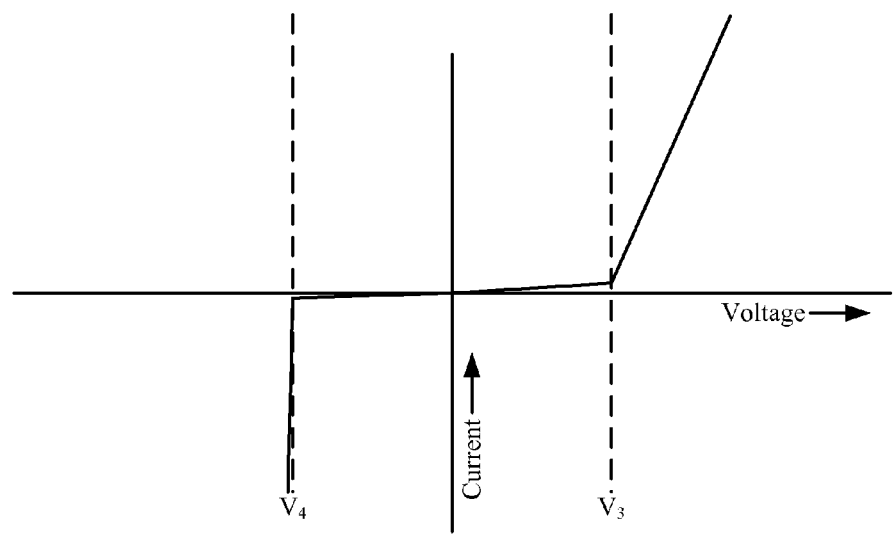
FIG. 9 is an I-V curve of a Zener diode like the diode of FIG. 7.

FIG. 9 shows an I-V curve of a Zener diode. The Zener diode behaves like a p-i-n diode under forward bias, with turn-on voltage $V_3$. Under reverse bias, however, once a critical voltage $V_4$ is reached, the Zener diode will allow a reverse current to flow. In a Zener diode the critical reverse voltage $V_4$ is substantially lower in magnitude than that of a one-way diode.

Such a controllable reverse current at moderate voltage is required to convert directional resistivity-switching material from the high-resistivity to the low-resistivity state, as described earlier and shown in FIG. 5B (at voltage $V_2$). Thus in embodiments of the present invention using directional resistivity-switching material, a Zener diode is preferred. (In reality, the distinction between a p-i-n diode having a very small intrinsic region and a Zener diode is artificial, but is made routinely by those skilled in the art.)

Nondirectional materials don't require current in both the forward and the reverse direction, but, as described, resistivity-switching can be achieved in either direction. For some circuit arrangements, then, it may be advantageous to pair a nondirectional resistivity-switching material with a Zener diode.

The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

High Current Requirements: To reset the resistivity-switching material, causing the transition from the high-resistivity to the low-resistivity state in nondirectional resistivity-switching materials, for some materials a relatively high current may be required. For these materials, it may be preferred for the diode to be germanium or a germanium alloy, which provides higher current at a given voltage compared to silicon.

Figure 10:
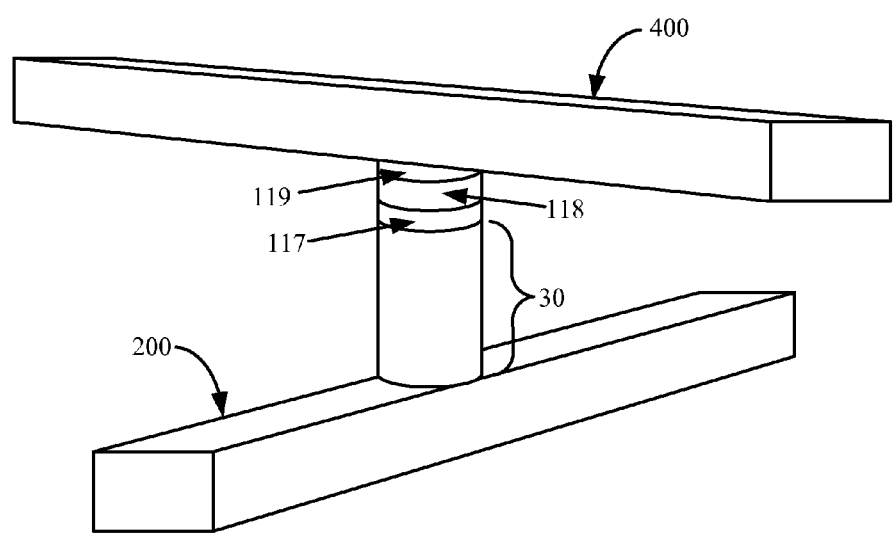
FIG. 10 is a perspective view of an embodiment of the present invention in which the resistance-switching material is sandwiched between noble metal layers.

Noble Metal Contacts and Low Temperature Fabrication: It has been observed that resistivity switching of some of the metal oxides and nitrides mentioned earlier is more easily and reliably achieved when the resistivity-switching material is sandwiched between noble metal contacts, which may be formed, for example, of Ir, Pt, Pd or Au. An example of a cell according to the present invention in which noble metal contacts are used is shown in FIG. 10. Resistivity-switching element 118 is between noble metal layers 117 and 119.

Use of noble metals poses challenges, however. When exposed to high temperature, noble metals tend to diffuse rapidly, and may damage other parts of the device. For example, in FIG. 10, noble metal layer 117 is adjacent to semiconductor diode 30. Extensive diffusion of a noble metal into the semiconductor material of diode 30 will damage device performance.

When the resistivity-switching element is formed between noble metal contacts, then, it is advantageous to minimize processing temperatures. The diode may be silicon, germanium, or a silicon-germanium alloy. Germanium can be crystallized at lower temperatures than silicon, and as the germanium content of a silicon-germanium alloy increases, the crystallization temperature decreases. Diodes formed of germanium or germanium alloys may be preferred when noble metal contacts are used.

Conventional deposition and crystallization temperatures of polycrystalline silicon (in this discussion polycrystalline silicon will be referred to as polysilicon while polycrystalline germanium will be referred to as polygermanium) are relatively high, rendering use of conventionally formed polysilicon diodes incompatible with certain metals having relatively low melting points.

For example, aluminum wires begin to soften and extrude when exposed to temperatures above about 475° C. For this reason, in many of the embodiments of the '470, '549, and '824 applications, it is preferred to use tungsten in the conductors, as tungsten wiring can withstand higher temperatures.

If germanium or a germanium alloy is used, however, the lower deposition and crystallization temperatures of germanium may allow the use of aluminum or even copper in the conductors, for example in conductors 200 and 400 of FIG. 10. These metals have low sheet resistance, and thus are generally preferable if the thermal budget allows their use, though tungsten or some other conductive material may be used instead.

Any of the teachings of U.S. patent application Ser. No. 11/125,606, "High-Density Nonvolatile Memory Array Fabricated at Low Temperature Comprising Semiconductor Diodes," hereby incorporated by reference, which relate to low-temperature fabrication may be applicable when low temperatures are preferred.

Conductivity and Isolation: It has been described that to enable programming in large arrays, a diode is included in each memory cell to provide electrical isolation between neighboring cells. Some resistivity-switching materials are deposited in a high-resistivity state, while others are deposited in a low-resistivity state. For a resistivity-switching material deposited in a high-resistivity state, in general, conversion to a low-resistivity state is a localized phenomenon.

Figure 11A:
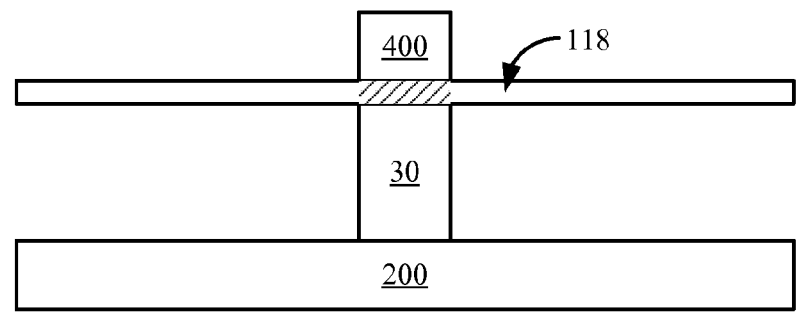
FIG. 11A is a cross-sectional view illustrating an embodiment of the present invention in which the resistance-switching material is not patterned and etched.

For example, referring to FIG. 11A, suppose a memory cell (shown in cross-section) includes a rail-shaped bottom conductor 200, extending left to right across the page, a diode 30, a layer 118 of resistivity-switching material formed in a high-resistivity state, and a rail-shaped top conductor 400 extending out of the page.

In this case, the layer 118 of resistivity-switching material has been formed as a blanket layer. So long as the high-resistivity state of the layer 118 of resistivity-switching material is sufficiently high, layer 118 will not provide an undesired conductive path, shorting conductor 400 to adjacent conductors or diode 30 to adjacent diodes.

When layer 118 of resistivity-switching material is exposed to a high voltage and is converted to a low-resistivity state, it is expected that only the areas of layer 118 immediately adjacent to the diode will be converted; for example, after programming, the shaded region of layer 118 will be low-resistivity, while the unshaded region will remain high-resistivity. The shaded regions are resistivity-switching elements disposed within a continuous layer 118 of resistivity-switching material.

Depending on the read, set, and reset voltages, however, for some resistivity-switching materials, the high-resistivity state of the resistivity-switching material may be too conductive for reliable isolation, and will tend to short adjacent conductors or diodes when formed in a continuous layer as in FIG. 11A.

Figure 11B:
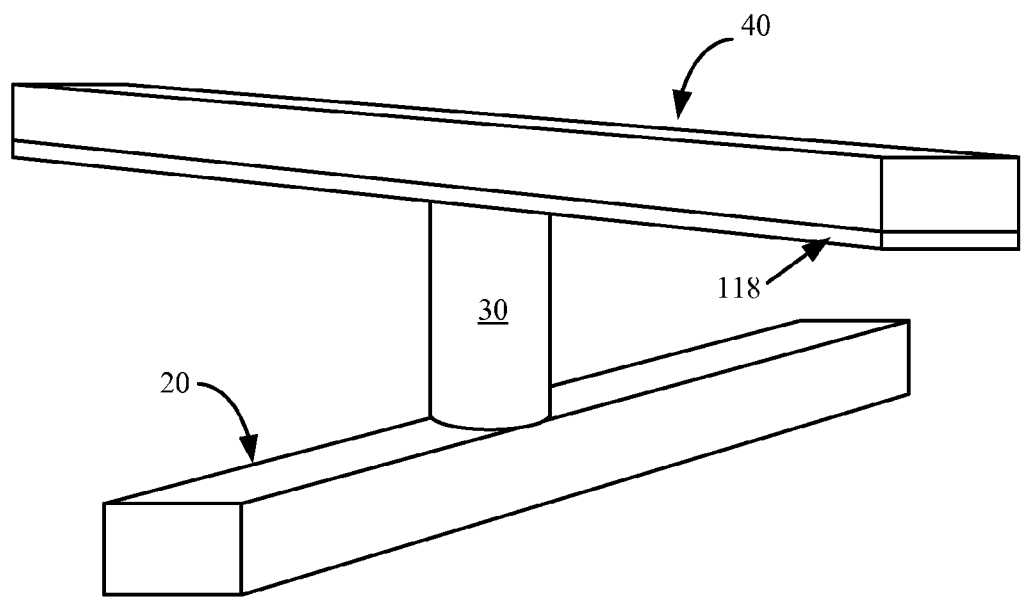
FIG. 11B is a perspective view of a preferred embodiment of the present invention in which the resistance-switching material is patterned and etched with the top conductor.

For different resistivity-switching materials, then, it may provide desirable to a) leave the resistivity-switching material 118 unpatterned, as in the device of FIG. 11A, or b) pattern the resistivity-switching material 118 with the top or bottom conductors, as in the device of FIG. 11B (in perspective view), or c) pattern the resistivity-switching material 118 with the diode 30, as in the devices of FIGS. 2 and 10.

When a memory element is formed of a resistivity-switching material which is formed in a low-resistivity state, it must be isolated from the resistivity-switching memory element of adjacent cells to avoid forming an unwanted conductive path between them.

As described in detail in the '549 application, and in U.S. patent application Ser. No. 11/148,530, "Nonvolatile Memory Cell Operating by Increasing Order in Polycrystalline Semiconductor Material," filed Jun. 8, 2005, hereinafter the '530 application and hereby incorporated by reference, for a polycrystalline semiconductor diode formed according to the methods detailed therein, it may be expected that in some embodiments the polycrystalline of the diode will be formed in an initial high-resistivity state, and, upon application of a sufficiently high voltage, will be permanently converted to a low-resistivity state. Thus, referring to the cell of FIG. 2, when this cell is initially formed, both the polysilicon of diode 30 and the reversible resistance-switching element 118 are formed in a high-resistivity state.

Upon first application of a programming voltage, both the polysilicon of diode 30 and the resistivity-switching element 118 will be converted to their low-resistivity states. In general the conversion of the diode 30 is permanent, while the conversion of resistivity-switching element 118 is reversible. It may be desirable to perform the initial conversion of the polysilicon of the diodes from high-resistivity to low-resistivity in factory conditions, effectively "preconditioning" the diode.

Alternatively, U.S. patent application Ser. No. 10/954,510, "Memory Cell Comprising a Semiconductor Junction Diode Crystallized Adjacent to a Silicide," filed Sep. 29, 2004, hereinafter the '510 application, which is assigned to the assignee of the present invention and hereby incorporated by reference, describes a method to form a polycrystalline semiconductor diode which is in a low-resistivity state as formed.

In preferred embodiments of the '510 application, the semiconductor material of the diode, generally silicon, is crystallized adjacent to a silicide layer, for example $TiSi_2$. The silicide layer provides an orderly crystallization template for the silicon as it crystallizes, resulting in a highly crystalline diode as formed, with fewer crystalline defects. This technique could be used in the present invention. If the diode is germanium, a germanium diode is crystallized adjacent to a germanide layer, such as $TiGe_2$, which will provide an analogous crystallization template for the germanium. The germanium of such a diode will be a low-resistivity as formed, with no need for a "programming" step to create a low-resistance path through it.

One-Time Programmable Memory Cell: Two-State

A diode paired with a resistance-switching element has been described in embodiments of the present invention when used as a rewriteable memory cell. These elements can also be used in alternative embodiments to form a one-time-programmable memory cell. For nickel oxide, or any of the named resistivity-switching binary metal oxides or nitrides, which can switch between lower- and higher-resistivity states, the reset switch, from a lower-resistivity to a higher-resistivity state, may prove to be the more difficult one. (It will be understood that in this discussion "nickel oxide" may refer either to stoichiometric NiO or to a nonstoichiometric compound.)

While the actual switch mechanism is unclear, it appears that a certain voltage must be applied across the resistivity-switching layer to cause it to switch. If the set state of the material is very low-resistivity, and the material is highly conductive, it can be difficult to build sufficient voltage to cause the switch to take place. By using the memory cell of the present invention as a one-time programmable cell, the more difficult switch can be avoided. This generally simplifies programming circuitry.

One preferred resistivity-switching material, nickel oxide, is nondirectional, meaning that the material alone switches with either positive or negative voltage applied. In some embodiments, though, it has been found that, when paired with a diode, reset of a nickel oxide layer is most readily achieved with the diode under reverse bias. Extra transistors may be required in the substrate to provide negative voltage to reverse bias the diodes. These transistors consume substrate space, making the device more expensive, and forming these transistors may add process complexity. Thus in embodiments in which reverse bias is required for reset, using the cell as a write-once cell and avoiding reset avoids the difficulties of generating negative voltage.

In the simplest way to use a memory cell comprising a diode and a resistivity-switching layer according to the present invention as a one-time programmable memory cell, the cell has two values, unprogrammed and programmed, which correspond to two distinct read currents through the cell.

The set voltage will vary depending on the material used for the resistance-switching element, the thickness of the layer, characteristics of the material, and other factors. Increasing the pulse time may reduce the voltage required to set the material from high-resistance to low-resistance. The set voltage may vary from, for example, 4 volts to 10 volts.

As described earlier, if the diode is formed of polysilicon, crystallizing the polysilicon adjacent to a silicide having a lattice structure at an orientation which provides a good crystallization template for silicon will result in lower-defect, lower-resistivity polysilicon; while crystallizing adjacent only to materials having a poor lattice match, such as titanium nitride, will result in higher-defect, higher-resistivity polysilicon. If the diode is formed of more highly resistive polysilicon, application of a suitable programming voltage across a diode is required to convert the polysilicon to a low-resistivity state, leaving the diode with good rectifying behavior.

Further, it has been found that for some of the resistivity-switching metal oxides or nitrides formed in an initial high-resistivity state, in some embodiments, a forming pulse may be required to achieve the first switch from high to low resistivity. This forming pulse may require a higher voltage than subsequent low-to-high or high-to-low-resistivity switches. For example, in one trial, the forming pulse was about 8.5-9 volts, while subsequent set pulses were about 6.5-7 volts.

As described in U.S. patent application Ser. No. 11/287,452, "Reversible Resistivity-Switching Metal Oxide or Nitride Layer with added Metal," filed Nov. 23, 2005, hereinafter the '452 application and hereby incorporated by reference, adding a metal to the binary metal oxide or nitride can decrease set and reset voltages, and may decrease the amplitude of the forming pulse or eliminate the need for one entirely.

In general, the metal additive is between about 0.01 and about 5 percent of the metal atoms in the layer of metal oxide or nitride compound. Preferred metals to use for the metal additive are selected from the group consisting of cobalt, aluminum, gallium, indium, manganese, nickel, niobium, zirconium, titanium, hafnium, tantalum, magnesium, chromium, vanadium, boron, yttrium, and lanthanum. Thus many options are possible for a one-time-programmable memory cell including a binary metal oxide or nitride resistance-switching element and a diode. The effect of pairing the resistance-switching element with a diode of high- or low-resistivity polysilicon should be considered.

If the binary metal oxide or nitride is formed in a high-resistivity state and the diode is formed of low-defect, low-resistivity polysilicon, conversion of the memory cell to a programmed state, in which high current flows under a read voltage, is achieved by converting the binary metal oxide or nitride to the set state.

If the diode is formed of high-defect, high-resistivity polysilicon, however, the polysilicon of the diode must also undergo a programming voltage for the memory cell to behave as if programmed, allowing high current flow under applied read voltage.

Depending on the relative voltages required to cause the disorder-to-order conversion of the polysilicon and the high-to-low-resistivity conversion of the binary metal oxide or nitride, use of a low-defect polysilicon diode, the polysilicon crystallized adjacent to an appropriate silicide, may be preferred.

Another alternative, if a large forming pulse is required for binary metal oxide or nitride formed in a high-resistivity state, is to apply the forming pulse in a preconditioning step in the factory. The high voltage required for the forming pulse can be supplied from outside of the die, and thus need not be available on the die.

If reverse bias is required for reset, the reset pulse can also be applied in a further preconditioning step, so when the memory array is ready for the end user, the cells are in the reset state, and can be programmed by the lower, post-forming set voltage. In this way circuits on the die do not need to provide either the high-voltage forming pulse or negative voltage, simplifying circuit requirements.

Further, if preconditioning forming and reset pulses are applied in the factory, the large voltage required for a forming pulse may be sufficient to convert high-defect polysilicon of the diode from high-resistivity to low-resistivity. In this case, there is no disadvantage to using a non-silicided, high-defect diode, and the extra process complexity of providing the silicide template layer can be avoided.

Such a memory cell in a memory array, (wherein the memory cell comprises a resistivity-switching layer of a metal oxide or nitride compound, the metal oxide or nitride compound including exactly one metal), is programmed by a method comprising: programming the memory cell by changing the resistivity-switching layer from a first resistivity state to a second programmed resistivity state, wherein the second programmed resistivity state stores a data state of the memory cell. The memory array comprises circuitry to program and read the memory cell, and the circuitry is adapted to program the memory cell no more than one time. The memory array is a one-time-programmable array.

One-Time Programmable, Multiple States

In another embodiment, it may actually be preferred to pair the binary metal oxide or nitride with a diode formed of high-defect polysilicon. The two states of the polysilicon making up the diode, the initial high-resistivity state and the programmed low-resistivity state, can be used to store data, increasing the density of the memory cell.

For example, suppose a diode formed of high-defect polysilicon (not crystallized adjacent to an appropriate silicide) is paired with a layer of nickel oxide, the two arranged electrically in series between top and bottom conductors. The nickel oxide is formed in a high-resistivity state, requiring a forming pulse to effect the first conversion from high-resistivity to low-resistivity.

Suppose the diode requires a programming voltage of 8 volts to cause the disorder-to-order conversion described in the '530 application, converting the polysilicon to a higher-resistivity state. Suppose further that the voltage required by the nickel oxide for the forming pulse is 10 volts. (It will be understood the voltages given here are examples only. Voltages will change as device characteristics and other factors are varied.)

The memory cell as formed has high-resistivity nickel oxide and a diode of high-resistivity polysilicon. Table 1 below summarizes three data states that may be achieved by this memory cell. It also includes, for this example, the programming required to attain each state, and example read current to be expected for each data state at an applied read voltage of +2 volts:

TABLE 1

| Data State | Polysilicon State | Switching Layer State | Programming | Read current at +2 V |
|---|---|---|---|---|
| 00 | High-resistivity | Reset | No programming | $1 \times 10^{-10}$ amps |
| 10 | Low-resistivity | Reset | +8 V | $1 \times 10^{-8}$ amps |
| 11 | Low-resistivity | Set | +11 V | $1 \times 10^{-5}$ amps |

With no programming voltage applied, the memory cell as formed is in a first data state, which for convenience will be called the '00' state. Application of +8 volts is sufficient to convert the polysilicon of the diode from high-resistivity to low-resistivity, but is below the voltage required for the forming pulse, leaving the nickel oxide in its initial, high-resistivity state; this data state will be called '10'. Application of +11 volts to a cell in the initial '00' state is sufficient both to effect the disorder-to-order conversion of the polysilicon and to set the nickel oxide to a low-resistivity state. This data state will be called the '11' state.

In another embodiment, no forming pulse, or only a small forming pulse, may be required, and the set voltage may be less than the voltage required to switch the polysilicon. In this case, the achievable data states are summarized in Table 2:

TABLE 2

| Data State | Polysilicon State | Switching Layer State | Programming | Read current at +2 V |
|---|---|---|---|---|
| 00 | High-resistivity | Reset | No programming | $1 \times 10^{-10}$ amps |
| 01 | High-resistivity | Set | +6 V | $1 \times 10^{-9}$ amps |
| 11 | Low-resistivity | Set | +8 V | $1 \times 10^{-5}$ amps |

As formed, the memory cell is in the '00' state, with both polysilicon and nickel oxide high-resistivity. Applying +6 volts sets the nickel oxide, but is not sufficient to switch the polysilicon, leaving the cell in the '01' state. Applying 8 volts switches both the polysilicon and the nickel oxide, leaving both in the low-resistivity states, corresponding to the '11' data state.

In either of these embodiments, once the cell is in the '11' state, a fourth data state, in which the polysilicon of the diode is in the low-resistivity state and the nickel oxide is in the reset state, can be achieved by resetting the nickel oxide. This state will be called the '10' state, and, in embodiments in which reverse bias is required for reset, is achieved by applying a negative reset pulse, say −4 volts to a cell in the '11' state.

To summarize, the memory cell just described is programmed by a method comprising i) applying a first programming pulse to the memory cell wherein the first programming pulse: a) detectably changes a first resistivity state of the resistivity-switching layer; or b) detectably changes a second resistivity state of the polycrystalline semiconductor material, or c) detectably changes the first resistivity state of the resistivity-switching layer and detectably changes the second resistivity state of the polycrystalline semiconductor material; and ii) reading the memory cell, wherein the first resistivity state of the resistivity switching layer serves to store data and the second resistivity state of the polycrystalline semiconductor material serves to store data. The memory cell is adapted to store one of three or four data states.

Multiple Resistance Levels

The resistivity-switching binary oxides or nitrides mentioned herein are capable of attaining more than just two stable resistivity states. In some embodiments, then, memory cells of an array formed according to the present invention are capable of storing more than two data states, for example three, four, or more data states, by putting the metal oxide or nitride in one of three, four, or more detectably distinct resistivity states. Detectably distinct data states can reliably be detected by sensing and decoding circuitry in the array. These embodiments can be either rewriteable or one-time-programmable.

Figure 12:
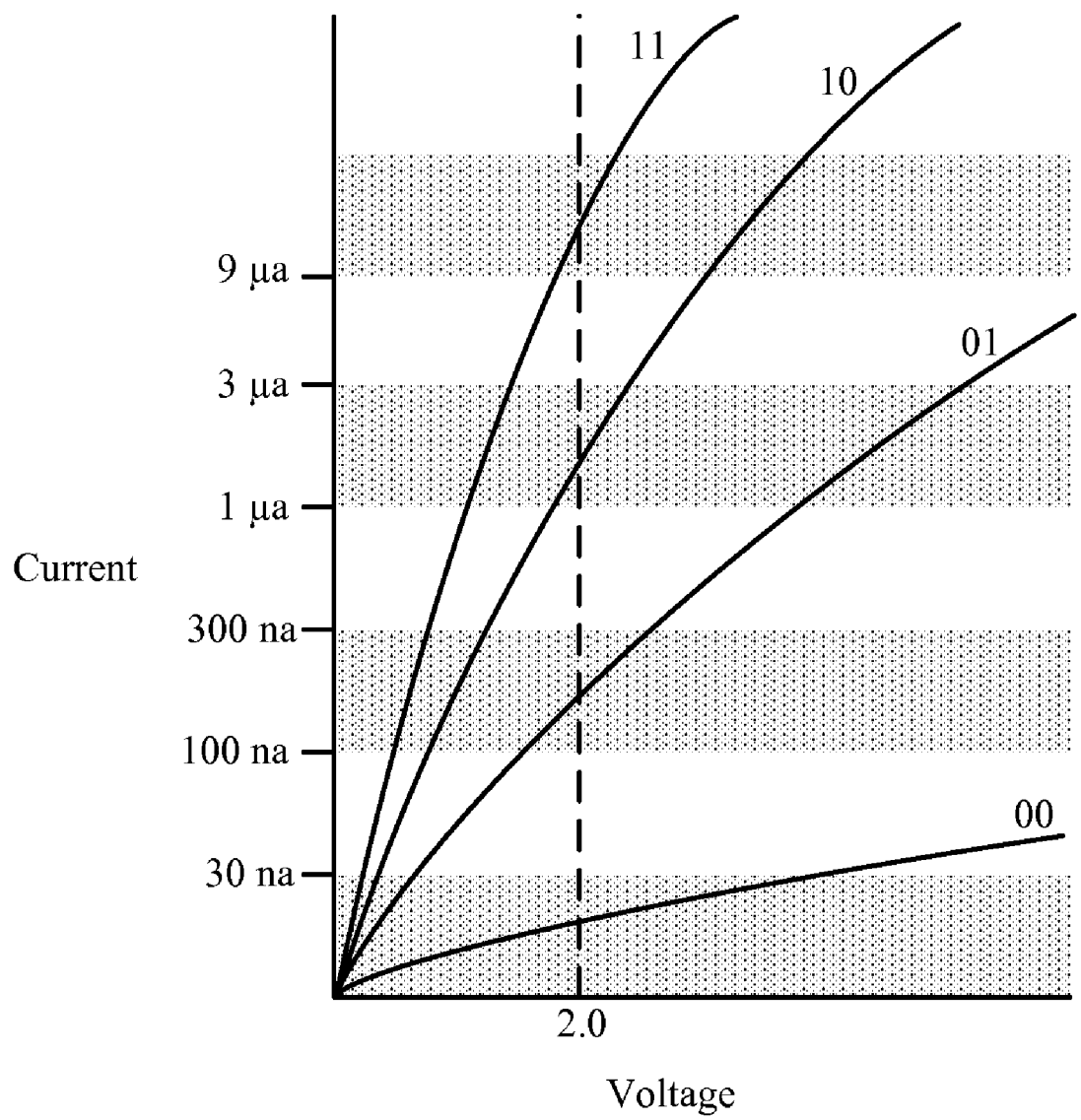
FIG. 12 is a graph depicting current vs. voltage for four different data states of a memory cell in an embodiment of the present invention.

For example, suppose the resistivity-switching metal oxide or nitride is nickel oxide (it will be understood that any of the other named materials may be used), which has been formed in a high-resistivity state. Turning to FIG. 12, as formed the nickel oxide is in the lowest-resistivity state, shown on the curve labeled 00.

The nickel oxide may be put into more than two detectably distinct resistivity states. For example, a memory cell like the one shown in FIG. 2 may have four different states, each distinguished by a range of current flow under an applied read voltage, for example about 2 volts.

In this example, in the highest-resistivity state, less than about 30 nanoamps of current flows when 2 volts is applied across the memory cell; this will be called the '00' state. In the '01' state, at 2 volts, the current will be between about 100 and 300 nanoamps. In the '10' state, at 2 volts, the current will be between about 1 microamp and 3 microamps. In the lowest-resistivity state, the '11' state, the current at 2 volts will be more than 9 microamps. It will be understood that these current ranges and read voltage are supplied for clarity only; depending on the actual materials used and the characteristics of the device, other values may be appropriate.

In this example, a set pulse has a voltage between about 8 and about 10 volts, while a reset voltage is between about 3 and about 6 volts. In embodiments including nickel oxide paired with a p-i-n diode, the reset voltage is applied in reverse bias. Depending on the material used and the configuration and characteristics of the memory cell, though, reverse bias may not be required to reset the cell.

Referring to FIG. 12, the cell is formed in the '00' state. To program the cell to the 01 state, a set voltage of, for example, 8 volts may be applied. For all set pulses a current limiter is preferably included in the circuit. After application of the set pulse, the cell is read at 2 volts.

If the current at 2 volts is in the expected range for the '01' state, between about 100 and about 300 nanoamps, the cell is considered to be programmed. If the current is too low, (80 nanoamps, for example) an additional set pulse, optionally at a higher set voltage, is applied, and the cell is read again at 2 volts. The process is repeated until the current through the memory cell is within the correct range at 2 volts.

After a programming pulse is applied, the current may instead be above the acceptable range for the '01' state; it may be 400 nanoamps, for example. There are two options in this case; either a reset pulse sufficient to return the nickel oxide to the '00' state can be applied, followed by another, possibly smaller, set pulse; or a reset pulse can be applied to increase the resistivity of the nickel oxide layer slightly, moving it incrementally into the '01' range. The process is repeated until the current through the memory cell is within the correct range at 2 volts.

A similar approach is taken to place the memory cell in the '10' or '11' states. For example, a set voltage of 9.5 volts may be sufficient to place the memory cell in the '10' state, while a set voltage of 10 volts may program the memory cell to the '11' data state.

The memory cell is preferably used as a rewriteable memory cell. However, it may be preferable, to save space in the substrate, to omit transistors capable of applying reverse bias, and only program the cell under forward bias. If reverse bias is not required to reset the cell, such a memory array may be rewriteable.

If reverse bias is required for reset, however, such a memory array could be used as a one-time programmable array. In this case great care must be taken never to set the cell to a state with higher current (lower resistivity of the nickel oxide layer) than desired for the intended data state. Deliberately low set voltages can be applied to lower the resistivity of the nickel oxide layer gradually and raise the current into the acceptable range, avoiding ever topping the desired range, since in this case, with no reverse bias, this overshoot could not be corrected.

As in prior embodiments, the advantages or disadvantages of forming a diode of low-defect polysilicon by crystallizing the polysilicon adjacent to an appropriate silicide should be considered. If a high-amplitude forming pulse is required, the voltage of the forming pulse may be sufficient to convert high-defect, high-resistivity polysilicon to lower-resistivity polysilicon; in this case the use of low-defect, silicided polysilicon may afford no advantage. If no forming pulse or a small forming pulse is required, a diode formed of low-defect, low-resistivity polysilicon, crystallized adjacent to an appropriate silicide, may be preferred.

If a preconditioning step, such as a forming pulse, must be applied, it may be advantageous to perform this step in the factory. In this case the high voltage need not be present on the die.

First Fabrication Example

A detailed example will be provided of fabrication of a monolithic three dimensional memory array formed according to a preferred embodiment of the present invention. For clarity many details, including steps, materials, and process conditions, will be included. It will be understood that this example is non-limiting, and that these details can be modified, omitted, or augmented while the results fall within the scope of the invention.

In general, the '470 application, the '549 application, the '824 application, and the '577 application teach memory arrays comprising memory cells, wherein each memory cell is a one-time programmable cell. The cell is formed in a high-resistance state, and, upon application of a programming voltage, is permanently converted to a low-resistance state.

Specifically, teachings of the '470, '549, '824, '577 and other incorporated applications and patents may be relevant to formation of a memory according to the present invention. For simplicity, not all of the details of the incorporated applications and patents will be included, but it will be understood that no teaching of these applications or patents is intended to be excluded.

Figure 13A:
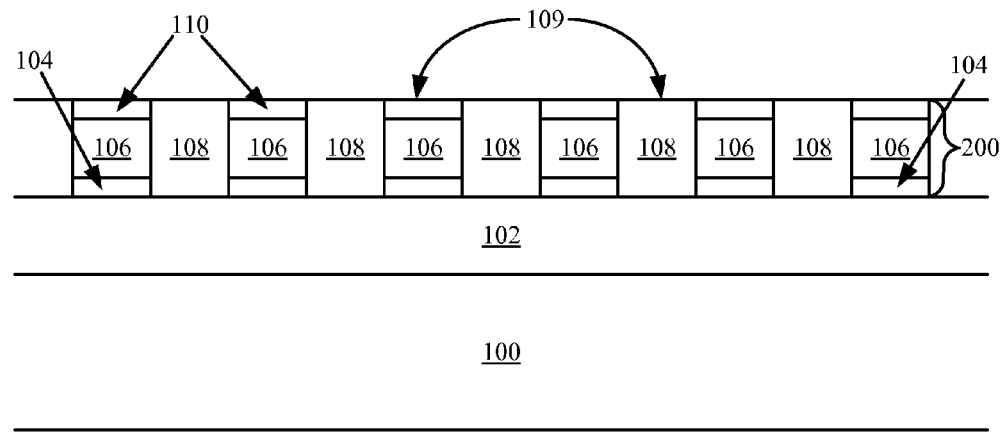
FIGS. 13A-13C are cross-sectional views illustrating stages in the formation of a memory level of a monolithic three dimensional memory array formed according to a preferred embodiment of the present invention.

Turning to FIG. 13A, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106 to help the conducting layer 106 adhere. A preferred material for the adhesion layer 104 is titanium nitride, though other materials may be used, or this layer may be omitted. Adhesion layer 104 can be deposited by any conventional method, for example by sputtering.

The thickness of adhesion layer 104 can range from about 20 to about 500 angstroms, and is preferably between about 100 and about 400 angstroms, most preferably about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, such as doped semiconductor, metals such as tungsten, or conductive metal silicides; in a preferred embodiment, conducting layer 106 is aluminum.

The thickness of conducting layer 106 can depend, in part, on the desired sheet resistance and therefore can be any thickness that provides the desired sheet resistance. In one embodiment, the thickness of conducting layer 106 can range from about 500 to about 3000 angstroms, preferably about 1000 to about 2000 angstroms, most preferably about 1200 angstroms.

Another layer 110, preferably of titanium nitride, is deposited on conducting layer 106. It may have thickness comparable to that of layer 104. A photolithography step will be performed to pattern aluminum layer 106 and titanium nitride layer 104. The high reflectivity of aluminum makes it difficult to successfully perform photolithography directly on an aluminum layer. Titanium nitride layer 110 serves as an anti-reflective coating.

Once all the layers that will form the conductor rails have been deposited, the layers will be patterned and etched using any suitable masking and etching process to form substantially parallel, substantially coplanar conductors 200, shown in FIG. 13A in cross-section.

In one embodiment, photoresist is deposited, patterned by photolithography and the layers etched, and then the photoresist removed, using standard process techniques such as "asking" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition ("CVD"), or, for example, high-density plasma CVD ("HDPCVD").

Finally, excess dielectric material 108 on top of conductor rails 200 is removed, exposing the tops of conductor rails 200 separated by dielectric material 108, and leaving a substantially planar surface 109. The resulting structure is shown in FIG. 13A. This removal of dielectric overfill to form planar surface 109 can be performed by any process known in the art, such as etchback or chemical mechanical polishing ("CMP").

For example, the etchback techniques described in U.S. patent application Ser. No. 10/883,417, "Nonselective Unpatterned Etchback to Expose Buried Patterned Features," filed Jun. 30, 2004, hereinafter the '417 application, and hereby incorporated by reference in its entirety, can advantageously be used.

In preferred embodiments, then, bottom conductors 200 are formed by depositing a first layer or stack of conductive material; patterning and etching the first layer or stack of conductive material to form first conductors; and depositing dielectric fill between the first conductors.

Alternatively, conductor rails can be formed by a damascene process, in which oxide is deposited, trenches are etched in the oxide, then the trenches are filled with conductive material to create the conductor rails. Formation of conductors 200 using a copper damascene process is described in U.S. patent application Ser. No. 11/125,606, "High-Density Nonvolatile Memory Array Fabricated at Low Temperature Comprising Semiconductor Diodes." Copper damascene conductors include at least a barrier layer and a copper layer.

Figure 13B:
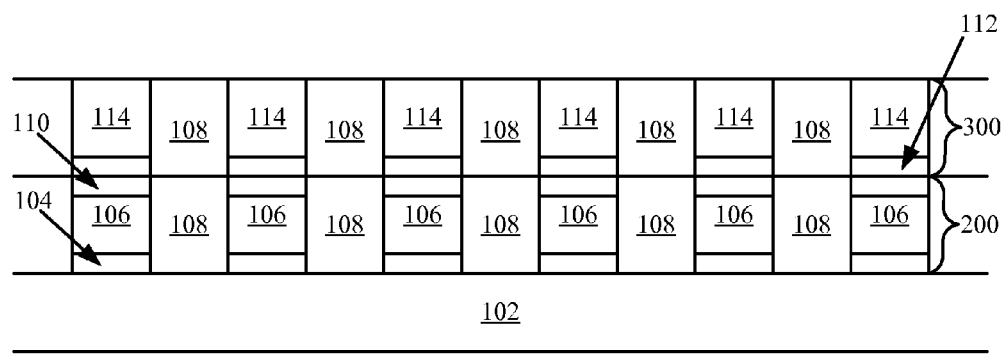

Next, turning to FIG. 13B, vertical pillars will be formed above completed conductor rails 200. (To save space substrate 100 is omitted in FIG. 13B and subsequent figures; its presence will be assumed.) Semiconductor material that will be patterned into pillars is deposited. The semiconductor material can be germanium, silicon, silicon-germanium, silicon-germanium-carbon, or other suitable IV-IV compounds, gallium arsenide, indium phosphide, or other suitable III-V compounds, zinc selinide, or other II-VII compounds, or a combination.

Silicon-germanium alloys of any proportion of silicon and germanium, for example including at least 20, at least 50, at least 80, or at least 90 atomic percent germanium or pure germanium may be used. The present example will describe the use of pure germanium. The term "pure germanium" does not exclude the presence of conductivity-enhancing dopants or contaminants normally found in a typical production environment.

In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type.

In this example, bottom heavily doped region 112 is heavily doped n-type germanium. In a most preferred embodiment, heavily doped region 112 is deposited and doped with an n-type dopant such as phosphorus by any conventional method, preferably by in situ doping. This layer is preferably between about 200 and about 800 angstroms.

Next the germanium that will form the remainder of the diode is deposited. In some embodiments a subsequent planarization step will remove some germanium, so an extra thickness is deposited. If the planarization step is performed using a conventional CMP method, about 800 angstroms of thickness may be lost (this is an average; the amount varies across the wafer. Depending on the slurry and methods used during CMP, the germanium loss may be more or less.) If the planarization step is performed by an etchback method, only about 400 angstroms of germanium or less may be removed.

Depending on the planarization method to be used and the desired final thickness, between about 800 and about 4000 angstroms of undoped germanium is deposited by any conventional method; preferably between about 1500 and about 2500 angstroms; most preferably between about 1800 and about 2200 angstroms. If desired, the germanium can be lightly doped. Top heavily doped region 116 will be formed in a later implant step, but does not exist yet at this point, and thus is not shown in FIG. 13B.

The germanium just deposited will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating ("BARC") on top, then patterned and etched. Similarly, dielectric antireflective coating ("DARC") can be used as a hard mask.

The photolithography techniques described in U.S. patent application Ser. No. 10/728,436, "Photomask Features with Interior Nonprinting Window Using Alternating Phase Shifting," filed Dec. 5, 2003; or U.S. patent application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between pillars 300, filling the gaps between them. Dielectric material 108 can be any known electrically insulating material, such as silicon oxide, silicon nitride, or silicon oxynitride. In a preferred embodiment, silicon dioxide is used as the insulating material. The silicon dioxide can be deposited using any known process, such as CVD or HDPCVD.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in the '417 application can be used. The resulting structure is shown in FIG. 13B.

Figure 13C:
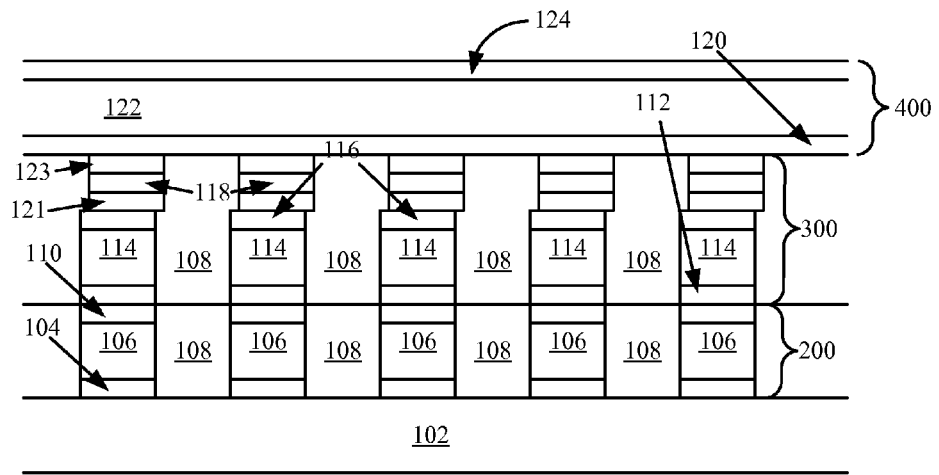

Turning to FIG. 13C, in preferred embodiments, heavily doped top regions 116 are formed at this point by ion implantation with a p-type dopant, for example boron or $BF_2$. The diode described herein has a bottom n-type region and a top p-type region. If preferred, the conductivity types could be reversed. If desired, p-i-n diodes having an n-region on the bottom could be used in one memory level while p-i-n diodes having a p-type region on the bottom could be used in another memory level.

The diodes that reside in pillars 300 were formed by a method comprising depositing a semiconductor layer stack above the first conductors and dielectric fill; and patterning and etching the semiconductor layer stack to form the first diodes.

Next a layer 121 of a conductive barrier material, for example titanium nitride, a metal, or some other appropriate material, is deposited. The thickness of layer 121 may be between about 100 and about 400 angstroms, preferably about 200 angstroms. In some embodiments, layer 121 may be omitted.

A layer 118 of a metal oxide or nitride resistance-switching material is deposited on barrier layer 121. This layer is preferably between about 50 and about 400 angstroms, for example between about 100 and about 200 angstroms. Layer 118 can be any of the materials described earlier, and is preferably formed of a metal oxide or nitride having including exactly one metal which exhibits resistance switching behavior; preferably a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

For simplicity this discussion will describe the use of nickel oxide in layer 118. It will be understood, however, that any of the other materials described can be used. Nickel oxide exhibits nondirectional switching behavior, and thus has been paired with a p-i-n diode, though a Zener diode could have been used had the circuit arrangement dictated such a choice.

As described earlier, had a directional resistance switching material been selected, a Zener diode would have been preferred. In a preferred embodiment, such a Zener diode has no intrinsic region, or has an intrinsic region no thicker than about 350 angstroms.

Finally in preferred embodiments barrier layer 123 is deposited on nickel oxide layer 118. Layer 123 is preferably titanium nitride, though some other appropriate conductive barrier material may be used instead. The purpose of barrier layer 123 is to allow an upcoming planarization step to be performed on barrier layer 123 rather than nickel oxide layer 118. In some embodiments, layer 123 may be omitted.

Layers 123, 118, and 121 are patterned and etched to form short pillars, ideally directly on top of pillars 300 formed in the previous pattern and etch step. Some misalignment may occur, as shown in FIG. 13C, and can be tolerated. The photomask used to pattern pillars 300 may be reused in this patterning step.

In this example, layers 123, 118, and 121 were patterned in a different patterning step than germanium layers 112 and 114 (and 116, formed in a subsequent ion implantation step.) This may be desirable in order to reduce etch height and to avoid possible contamination by having nickel oxide and metal barrier layers exposed in a chamber devoted to semiconductor etch.

In other embodiments, however, it may be preferred to pattern layers 123, 118, 121, 116, 114, and 112 in a single patterning step. In this case the ion implantation of heavily doped germanium layer 116 takes place before the deposition of barrier layer 121. Alternatively, heavily doped layer 116 may be in situ doped.

In some embodiments, barrier layer 121, nickel oxide layer 118, and barrier layer 123 can be formed before (and therefore beneath) diode layers 112, 114, and 116, and may be patterned in the same or in a separate patterning step.

Next a conductive material or stack is deposited to form the top conductors 400. In a preferred embodiment, titanium nitride barrier layer 120 is deposited next, followed by aluminum layer 122 and top titanium nitride barrier layer 124.

Top conductors 400 can be patterned and etched as described earlier. In this example in each cell the diode (of layers 112, 114, and 116) and a resistance-switching element (a portion of nickel oxide layer 118) have been formed in series between top conductor 400 and bottom conductor 200.

Overlying second conductors 400 will preferably extend in a different direction from first conductors 200, preferably substantially perpendicular to them. The resulting structure, shown in FIG. 13C, is a bottom or first story of memory cells.

In an alternative embodiment, top conductors can comprise copper, and can be formed by a damascene method. A detailed description of fabrication of top copper conductors in a monolithic three dimensional memory array is provided in detail in U.S. patent application Ser. No. 11/125,606, "High-Density Nonvolatile Memory Array Fabricated at Low Temperature Comprising Semiconductor Diodes."

In preferred embodiments, this first story of memory cells is a plurality of nonvolatile memory cells comprising: a first plurality of substantially parallel, substantially coplanar conductors extending in a first direction; a first plurality of diodes; a first plurality of reversible resistance-switching elements; and a second plurality of substantially parallel, substantially coplanar conductors extending in a second direction different from the first direction, wherein, in each memory cell, one of the first diodes and one of the first reversible resistance-switching elements are arranged in series, disposed between one of the first conductors and one of the second conductors, and wherein the first plurality of reversible resistance-switching elements comprise a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$. The first conductors are formed at a first height and the second conductors are formed at a second height, the second height above the first height.

Additional memory levels can be formed above this first memory level. In some embodiments, conductors can be shared between memory levels; i.e. top conductor 400 would serve as the bottom conductor of the next memory level.

In other embodiments, an interlevel dielectric is formed above the first memory level of FIG. 13C, its surface planarized, and construction of a second memory level begins on this planarized interlevel dielectric, with no shared conductors. If top conductors 400 are not shared between memory levels, then no CMP step need be performed on these conductors. In this case, if desired, titanium nitride barrier layer 124 may be replaced with a layer of DARC.

Deposited germanium, when undoped or doped with n-type dopants and deposited at a relatively low temperature, as described, will generally be amorphous. After all of the memory levels have been constructed, a final relatively low-temperature anneal, for example performed at between about 350 and about 470° C., can be performed to crystallize the germanium diodes; in this embodiment the resulting diodes will be formed of polygermanium. Large batches of wafers, for example 100 wafers or more, can be annealed at a time, maintaining adequate manufacturing throughput.

Vertical interconnects between memory levels and between circuitry in the substrate are preferably formed as tungsten plugs, which can be formed by any conventional method.

Photomasks are used during photolithography to pattern each layer. Certain layers are repeated in each memory level, and the photomasks used to form them may be reused. For example, a photomask defining the pillars 300 of FIG. 13C may be reused for each memory level. Each photomask includes reference marks used to properly align it. When a photomask is reused, reference marks formed in a second or subsequent use may interfere with the same reference marks formed during a prior use of the same photomask.

U.S. patent application Ser. No. 11/097,496, "Masking of Repeated Overlay and Alignment Marks to Allow Reuse of Photomasks in a Vertical Structure," filed Mar. 31, 2005, and hereby incorporated by reference, describes a method to avoid such interference during the formation of a monolithic three dimensional memory array like that of the present invention.

Many variations on the steps and structures described here can be envisioned and may be desirable. To more fully illustrate the present invention, a few variations will be described; it will be understood that not every variation that falls within the scope of the invention need be fully detailed for those skilled in the art to understand how to make and use a still broader range of possible variations.

Second Fabrication Example

Noble Metal Contacts, Above Diode

FIG. 10 showed an embodiment in which resistance-switching material 118 was sandwiched between noble metal layers 117 and 119. Preferred noble metals are Pt, Pd, Ir and Au. Layers 117 and 119 may be formed of the same noble metal, or of different metals.

When the resistance switching material is sandwiched between noble metal layers, the noble metal layers must be patterned and etched to assure that they do not provide unwanted conductive paths between adjacent diodes or conductors.

Figure 14:
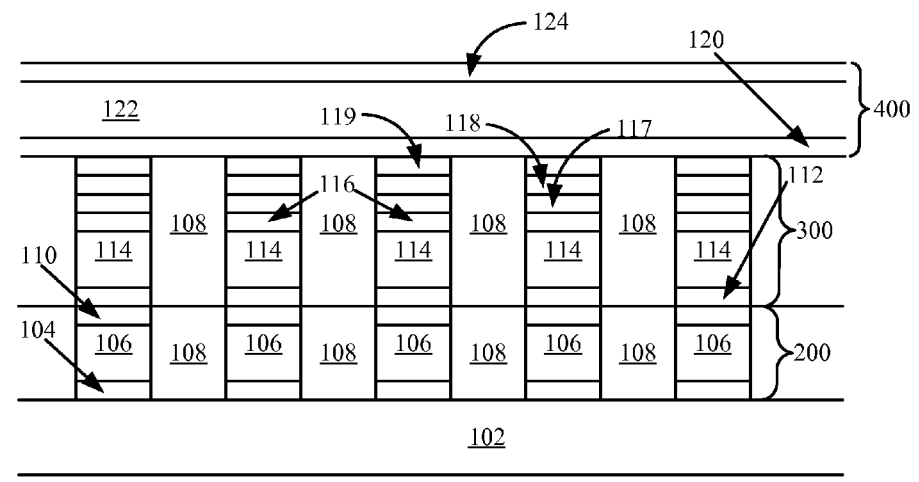
FIG. 14 is a cross-sectional view illustrating a portion of a monolithic three dimensional memory array formed according to a preferred embodiment of the present invention.

A memory level comprising cells like those of FIG. 10 is shown in cross-section in FIG. 14. In a preferred method to form this structure, bottom conductor 200 is formed as described earlier. Heavily doped germanium layer 112 and undoped germanium layer 114 are deposited as described earlier.

In one preferred embodiment, the ion implantation of top heavily doped layer 116 can be performed on the blanket germanium layer before the pillars are patterned and etched. Next noble metal layer 117 is deposited, followed by resistance-switching material 118 and noble metal layer 119. Noble metal layers 117 and 119 may be about 200 to about 500 angstroms, preferably about 200 angstroms.

The pillars are patterned and etched at this point, such that layers 117, 118, and 119 are included in the pillar, and thus are electrically isolated from each other. Depending on the etchants selected, it may be preferred to perform a first etch step, etching only layers 119, 118, and 117, then use these layers as a hard mask to etch the rest of the pillar.

Alternatively, layers 112, 114, and 116 may be patterned and etched, gaps between them filled, and tops of the pillars exposed through planarization first. Deposition of layers 117, 118, and 119 could follow, along with separate pattern and etch of those layers.

The gaps are filled and a CMP or etchback step performed as described earlier to create a substantially planar surface. Next top conductors 400 are formed on this planar surface as described earlier, comprising a titanium nitride layer 120, aluminum layer 122, and titanium nitride layer 124. Alternatively, top noble metal layer 119 could be deposited, patterned and etched with top conductors 400.

In another alternative, heavily doped layer 116 could be doped by in-situ doping rather than by ion implantation.

Third Fabrication Example

Noble Metal Contacts, Below Diode

Figure 15:
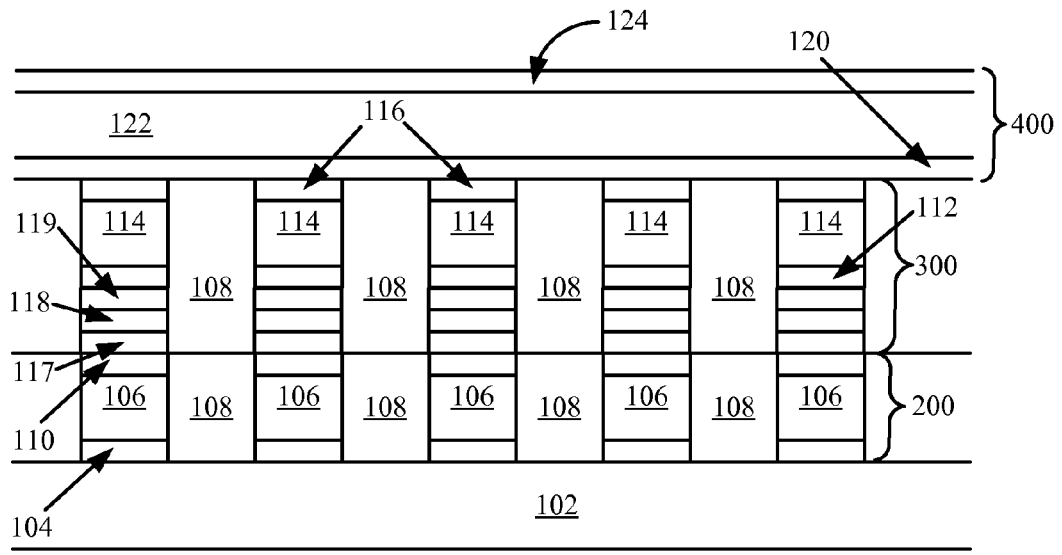
FIG. 15 is a cross-sectional view illustrating a portion of a monolithic three dimensional memory array formed according to a different preferred embodiment of the present invention.

In an alternative embodiment, shown in FIG. 15, the resistance-switching elements 118, in this case sandwiched between noble metal layers 117 and 119, are formed below the diode, rather than above it.

To form this structure, bottom conductors 200 are formed as described earlier. Layers 117, 118, and 119 are deposited on the planarized surface 109 of conductors 200 separated by gap fill. The germanium stack, including heavily doped layer 112 and undoped layer 114, are deposited. Layers 114, 112, 119, 118, and optionally 117 are patterned and etched as described earlier to form pillars 300.

After gap fill and planarization, top heavily doped region 116 is formed by ion implantation. Top conductors 400 are formed as in the previous embodiment, by depositing conductive layers, for example titanium nitride layer 120, aluminum layer 122, and titanium nitride layer 124, and patterning and etching to form the conductors 400.

As in other embodiments, if desired, layers 117, 118, and 119 could be patterned and etched separately from layers 110, 112, 114, and 116 rather than etching them all in a single patterning step.

In the preferred embodiments just described, what has been formed is a monolithic three dimensional memory array comprising: a) a first memory level formed above a substrate, the first memory level comprising: a first plurality of memory cells, wherein each memory cell of the first memory comprises a reversible resistance-switching element comprising a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$; and b) at least a second memory level monolithically formed above the first memory level.

Many other alternative embodiments can be imagined. For example, in some embodiments the noble metal layers 117 and 119 can be omitted. In this case resistance-switching material 118 can be patterned with bottom conductors 200, with pillars 300, or left as a continuous layer above or below the diodes.

An advantage of the embodiments just described is that use of germanium in the diode allows formation of a nonvolatile memory cell by forming a first conductor; forming a second conductor; forming a reversible resistance-switching element; and forming a diode, wherein the diode and the reversible resistance-switching element are disposed electrically in series between the first conductor and the second conductor, and wherein, during formation of the first and second conductors, diode, and switching element and crystallization of the diode, temperature does not exceed about 500° C.

Depending on the deposition and crystallization conditions used (a longer crystallizing anneal can be performed at lower temperatures), the temperature may not exceed about 350° C. In alternative embodiments, the deposition and crystallization temperatures of the semiconductor material may be arranged so that the maximum temperature does not exceed 475, 425, 400, or 375° C.

Fourth Fabrication Example

Silicided Diode

It may be preferred to form the diode of silicon, specifically of polysilicon crystallized adjacent to a silicide that may provide an advantageous crystallization template, such as titanium silicide or cobalt silicide, forming relatively low-defect, low-resistivity polysilicon.

Figure 16A:
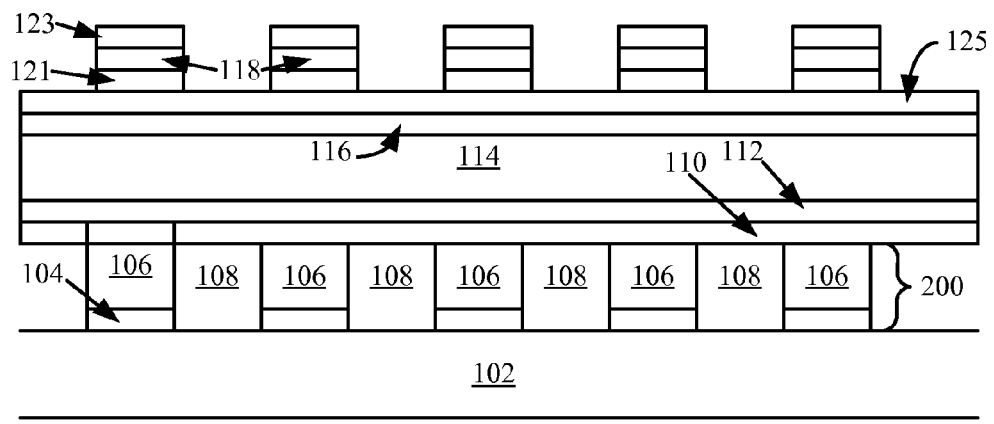
FIGS. 16A-16C are cross-sectional views illustrating stages in formation of a memory level of a monolithic three dimensional memory array formed according to yet another preferred embodiment of the present invention.

Referring to FIG. 16A, bottom conductors 200 can be formed as described earlier. Polysilicon generally requires a crystallization temperature incompatible with copper and aluminum, so a material able to tolerate high temperature, such as tungsten, may be the preferred conductive material 106 for bottom conductors 200.

In a preferred embodiment, adhesion layer 104 is deposited first, followed by tungsten layer 106, and these layers are patterned and etched to form substantially parallel conductors 200. Dielectric fill 108 is deposited over and between conductors 200, then a planarization step, for example by CMP, removes overfill, leaving conductors 200 and dielectric 108 exposed at a substantially planar surface.

Next a thin barrier layer 110, for example of titanium nitride, is deposited on the planar surface. Next the semiconductor material that will form the diode is deposited. In the present embodiment, the semiconductor material is preferably silicon or a silicon-rich silicon-germanium alloy. Heavily doped n-type region 112 is deposited first, preferably doped by in situ doping. This layer may be between about 100 and about 1000 angstroms thick, preferably about 200 angstroms.

Next intrinsic silicon is deposited, preferably to a thickness between about 800 and about 3300 angstroms. Heavily doped p-type region 116 at the top of the silicon stack is doped, preferably by ion implantation of a p-type dopant such as boron or $BF_2$, leaving middle region 114 undoped. In an alternative embodiment, heavily doped p-type region 116 is doped in situ.

A thin layer 125 of titanium, for example between about 50 and about 200 angstroms, is deposited. An optional barrier layer 121 is deposited next, followed by nickel oxide layer 118 (any of the other named resistivity-switching metal oxides or nitrides could be used instead) and optional top barrier layer 123, which may be of titanium nitride. The layer 118 of nickel oxide may include added metal, as described in the '452 application, which may serve to reduce switching voltages or currents and to reduce or eliminate the need for a forming pulse.

Barrier layer 123, nickel oxide layer 118, and barrier layer 121 are patterned and etched to form short pillars. Layer 118 of nickel oxide can be sputter etched, or is preferably etched using a chemical process as described in U.S. patent application Ser. No. 11/179,423, "Method of Plasma Etching Transition Metals and Their Compounds," filed Jun. 11, 2005 and hereby incorporated by reference. The structure at this point is shown in FIG. 16A.

Figure 16B:
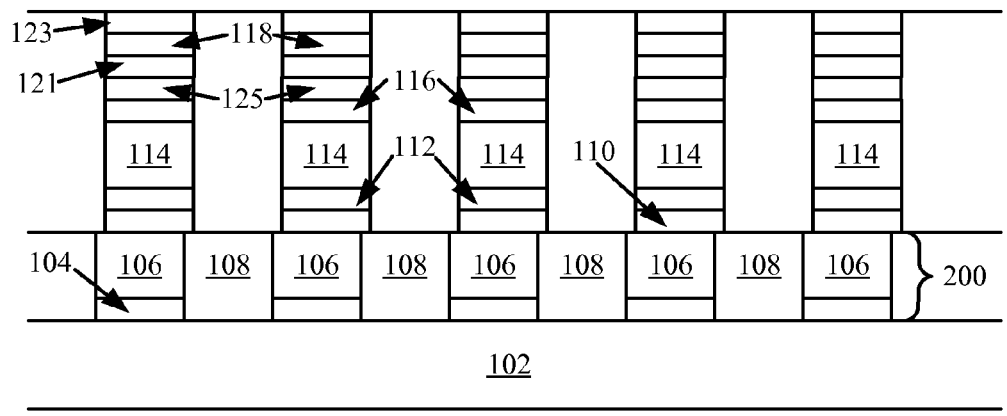

Turning to FIG. 16B, the etch continues, with etched layers 121, 118, and 123 serving as a hard mask during the etch of titanium layer 125, heavily doped p-type region 116, intrinsic region 114, heavily doped n-type region 112, and barrier layer 110, forming pillars 300. Dielectric material 108 is deposited over and between pillars 300, filling gaps between them.

A planarization step, for example by CMP, removes overfill of dielectric 108 and exposes optional barrier layer 123 (or, if barrier layer 123 was omitted, nickel oxide layer 118) at the tops of pillars 300, separated by fill 108. FIG. 16B shows the structure at this point.

Figure 16C:
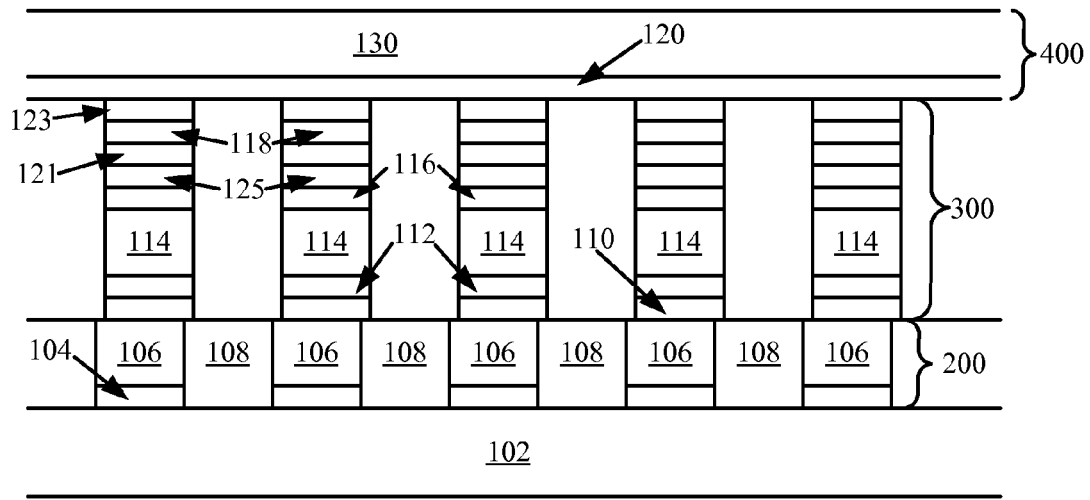

Referring to FIG. 16C, top conductors 400 are preferably formed as in prior embodiments, for example of adhesion layer 120 of titanium nitride and conductive layer 130 of tungsten.

An anneal step causes titanium layer 125 to react with silicon region 116, forming titanium silicide. A subsequent higher temperature anneal crystallizes the silicon of silicon regions 116, 114, and 112, forming a diode of relatively low-defect, low-resistivity polysilicon.

Many variations are possible in forming this memory cell. For example, if preferred, nickel oxide layer 118 and any associated barrier layers can be patterned and etched in a separate step, rather than in the same patterning step that forms the diode.

Fifth Fabrication Example

Non-Silicided Diode

It was noted that in one-time-programmable embodiments which use the resistivity state of the polysilicon of the diode to store a data state, it may be preferred to form a polysilicon diode which is not crystallized adjacent to a silicide that promotes formation of low-defect polysilicon.

In this case, the bottom conductors 200 are formed as described above. Pillars 300 are formed as described in the prior, silicided embodiment, with the exception that titanium layer 125, which in that embodiment reacted with silicon of the diode to form titanium silicide, is omitted. Layer 118 of nickel oxide and any associated barrier layers are preferably patterned and etched first, then serve as a hard mask to etch silicon regions 116, 114, and 112 and barrier layer 110.

Alternatively, diode layers 116, 114, and 112 can be patterned and etched first, gaps between them filled with dielectric and tops of the diodes exposed in a planarizing step, then nickel oxide layer 118 and its associated barrier layers deposited, then patterned and etched in a separate step.

As in all embodiments, a first story of memory cells has been formed. Additional memory levels may be stacked above this first memory level to form a monolithic three dimensional memory array, preferably formed above a semiconductor substrate.

One-time programmable monolithic three dimensional memory arrays are described in U.S. patent application Ser. No. 6,034,882, "Vertically Stacked Field Programmable Nonvolatile Memory and Method of Fabrication," U.S. Pat. No. 6,420,215, "Three Dimensional Memory Array and Method of Fabrication," and U.S. patent application Ser. No. 10/185,507, "Electrically Isolated Pillars in Active Devices," filed Jun. 27, 2002, all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a plurality of nonvolatile memory cells, the method comprising:
   forming a first plurality of substantially parallel, substantially coplanar first conductors;
   forming a first plurality of diodes above the first conductors;
   forming a first plurality of resistance-switching elements; and
   forming a second plurality of substantially parallel, substantially coplanar conductors above the first diodes,
   wherein the first resistance-switching elements comprise a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

2. The method of claim 1, wherein the first conductors are formed above a substrate.

3. The method of claim 2, wherein the substrate comprises monocrystalline silicon.

4. The method of claim 1, wherein each of the first diodes is arranged in series with one of the first resistance-switching elements.

5. The method of claim 1, wherein forming the first conductors comprises:
   depositing a first layer or stack of conductive material;
   patterning and etching the first layer or stack of conductive material to form first conductors; and
   depositing dielectric fill between the first conductors.

6. The method of claim 1, wherein forming the first diodes comprises:
   depositing a semiconductor layer stack above the first conductors; and
   patterning and etching the semiconductor layer stack to form the first diodes.

7. The method of claim 6, wherein the semiconductor layer stack comprises silicon, germanium, or an alloy thereof.

8. The method of claim 1, wherein forming the first resistance-switching elements comprises depositing a layer of resistance-switching material above the first conductors, the layer comprising a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

9. The method of claim 8, wherein forming the first resistance-switching elements further comprises patterning and etching the layer of resistance-switching material in the same patterning step used to pattern and etch the first diodes.

10. The method of claim 1, wherein the first conductors comprise aluminum.

11. The method of claim 1, wherein the first conductors comprise tungsten.

12. The method of claim 1, wherein the first diodes are in the form of vertically oriented pillars.

13. The method of claim 1, wherein forming the second conductors comprises:
depositing a second layer or stack of conductive material; and
patterning and etching the second layer or stack of conductive material to form second conductors.

14. The method of claim 13, wherein forming the first resistance-switching elements comprises depositing a layer of resistance-switching material above the first diodes, the layer comprising a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

15. The method of claim 14, wherein forming the first resistance-switching elements further comprises patterning and etching the layer of resistance-switching material in the same patterning step used to pattern and etch the second conductors.

16. A method for forming a monolithic three dimensional memory array, the method comprising:
a) forming a first memory level above a substrate, the first memory level formed by a method comprising:
i) forming a first plurality of diodes; and
ii) forming a first plurality of resistance-switching elements comprising material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, wherein each of the first diodes is arranged in series with one of the resistance-switching elements; and
b) monolithically forming at least a second memory level above the first memory level and above the substrate.

17. The method of claim 16, wherein the substrate comprises monocrystalline silicon.

18. The method of claim 16, wherein forming the first memory level further comprises:
forming a first plurality of substantially parallel, substantially coplanar conductors; and
forming a second plurality of substantially parallel, substantially coplanar conductors wherein the second conductors are above the first conductors.

19. The method of claim 18, wherein the first memory level comprises a first plurality of memory cells, wherein each memory cell comprises a portion of one of the first conductors, one of the first diodes, one of the resistance-switching elements, and a portion of one of the second conductors.

20. The method of claim 18, wherein forming the first diodes comprises:
depositing a first semiconductor layer stack above the first conductors and intervening dielectric gap fill; and
patterning and etching the first semiconductor layer stack to form the first diodes.

21. The method of claim 20, wherein patterning and etching the first semiconductor layer stack to form the first diodes comprises patterning and etching the semiconductor layer stack to form a first plurality of pillars.

22. The method of claim 16, wherein forming the first plurality of resistance-switching elements comprises depositing a first layer of resistance-switching material.

23. The method of claim 16, wherein monolithically forming at least the second memory level above the first memory level comprises depositing a second layer of resistance-switching material above the substrate.

24. The method of claim 16, wherein the first diodes comprise germanium, silicon, or alloys thereof.

25. A method for forming a monolithic three dimensional memory array, the method comprising:
forming a first plurality of substantially parallel, substantially coplanar conductors at a first height above a substrate and extending in a first direction;
forming a second plurality of substantially parallel, substantially coplanar conductors at a second height above the first height and extending in a second direction different from the first direction;
forming a first plurality of resistance-switching elements comprising a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$;
forming a first plurality of diodes, wherein the first diodes and the first resistance switching elements are above the first height and below the second height;
forming second diodes above the second conductors; and
forming third conductors above the second conductors.

26. The method of claim 25, wherein the monolithic three dimensional memory array comprises a first plurality of memory cells, each first memory cell comprising one of the first diodes and one of the resistance-switching elements arranged in series between one of the first conductors and one of the second conductors.

27. The method of claim 25 further comprising a second plurality of resistance-switching elements comprising a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, the second resistance-switching elements formed above the second conductors.

28. The method of claim 25, wherein the third conductors are above the second diodes.

29. The method of claim 25, further comprising a fourth plurality of substantially parallel, substantially coplanar conductors above the second diodes.

30. The method of claim 29, wherein the second diodes are above the third conductors.

31. The method of claim 25, wherein the first diodes comprise silicon, germanium, or an alloy of silicon or germanium.

32. A method for forming a nonvolatile memory cell, the method comprising:
forming a first conductor;
forming a second conductor;
forming a resistance-switching element; and
forming a diode, wherein the diode and the resistance-switching element are disposed electrically in series between the first conductor and the second conductor,
and wherein, during formation of the first and second conductors, diode, and switching element and crystallization of the diode, temperature does not exceed about 500° C.

33. The method of claim 32, wherein the resistance-switching element comprises a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

34. The method of claim 32, wherein the temperature does not exceed about 475° C.

35. The method of claim 32, wherein the temperature does not exceed about 400° C.

36. The method of claim 32, wherein the temperature does not exceed about 350° C.

37. The method of claim 32, wherein the diode comprises a semiconductor material, the semiconductor material consisting of germanium or a germanium alloy.

38. The method of claim 37, wherein the germanium alloy is at least 80 atomic percent germanium.

39. The method of claim 37, wherein the germanium alloy is at least 90 atomic percent germanium.

40. The method of claim 37, wherein the diode comprises a semiconductor junction diode.

41. The method of claim 37, wherein the semiconductor material is substantially polycrystalline.

42. The method of claim 32, wherein the first conductor or the second conductor comprises an aluminum layer.

43. The method of claim 32, wherein the first conductor or the second conductor comprises a copper layer.

44. The method of claim 32, wherein the substrate comprises monocrystalline silicon.

45. A method for forming a monolithic three dimensional memory array, the method comprising:
   i) forming a first memory level above a substrate, the first memory level comprising a plurality of first memory cells, each first memory cell comprising:
      a) a resistance-switching element; and
      b) a diode, wherein the temperature during formation of the first memory level does not exceed about 475° C.; and
   ii) monolithically forming at least a second memory level about the first memory level.

46. The method of claim 45, wherein the resistance-switching element of each first memory cell comprises a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$.

47. The method of claim 45, wherein the diode comprises semiconductor material, wherein the semiconductor material is germanium or a germanium alloy.

48. The method of claim 47, wherein the semiconductor material is at least 80 atomic percent germanium.

49. The method of claim 47, wherein the semiconductor material is at least 90 atomic percent germanium.

50. The method of claim 47, wherein the semiconductor material is substantially polycrystalline.

51. The method of claim 47, wherein:
   the first memory level further comprises a plurality of first conductors and a plurality of second conductors, the second conductors formed above the first conductors;
   each first memory cell comprises a portion of one of the first conductors and a portion of one of the second conductors; and
   the first conductors or the second conductors comprise an aluminum layer or a copper layer.

* * * * *